(12) United States Patent
Bae et al.

(10) Patent No.: US 11,357,107 B2
(45) Date of Patent: Jun. 7, 2022

(54) CIRCUIT BOARD AND ELECTRONIC DEVICE INCLUDING CIRCUIT BOARD

(71) Applicant: Samsung Electronics Co., Ltd., Suwon-si (KR)

(72) Inventors: Bumhee Bae, Suwon-si (KR); Sungsoo Kim, Suwon-si (KR); Kwangmo Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/133,380

(22) Filed: Dec. 23, 2020

(65) Prior Publication Data

US 2021/0195739 A1     Jun. 24, 2021

(30) Foreign Application Priority Data

Dec. 24, 2019    (KR) .......................... 10-2019-0174425

(51) Int. Cl.
    *H05K 1/11*         (2006.01)
    *H05K 1/02*         (2006.01)

(52) U.S. Cl.
    CPC .......... *H05K 1/115* (2013.01); *H05K 1/0224* (2013.01); *H05K 2201/09263* (2013.01); *H05K 2201/09545* (2013.01); *H05K 2201/10128* (2013.01)

(58) Field of Classification Search
    CPC .... H05K 1/115; H05K 1/0224; H05K 1/0218; H05K 1/0278; H05K 1/189; H05K 1/147;

(Continued)

(56) References Cited

U.S. PATENT DOCUMENTS

| 8,798,694 | B2 | 8/2014 | Morishita et al. |
| 2006/0285273 | A1* | 12/2006 | Chang .................... H01P 3/085 361/312 |

(Continued)

FOREIGN PATENT DOCUMENTS

| JP | 2009-111309 A | 5/2009 |
| JP | 2012094646 A | 5/2012 |

(Continued)

OTHER PUBLICATIONS

International Search Report dated Mar. 31, 2021 in connection with International Patent Application No. PCT/KR2020/018880, 3 pages.

(Continued)

*Primary Examiner* — Roshn K Varghese

(57) ABSTRACT

An electronic device includes a first electric element a second electric element, and a circuit board. The circuit board is configured to deliver a signal between the first electric element and the second electric element. The circuit board includes a first portion, a second portion, and a third portion. The second and third portions extend from the first portion with the first portion therebetween. The circuit board also includes at least one signal line extending from the second portion to the third portion, a plurality of ground patterns extending from the second portion to the third portion, a plurality of first conductive vias positioned at the second portion and electrically connecting the plurality of ground patterns, and a plurality of second conductive vias positioned at the third portion and electrically connecting the plurality of ground patterns. The plurality of ground patterns include a meander form at the first portion.

20 Claims, 13 Drawing Sheets

(58) Field of Classification Search
CPC ....... H05K 1/0221; H05K 2201/09263; H05K 2201/09545; H05K 2201/10128; H05K 2201/09109; H05K 3/4691; H04M 1/0214
See application file for complete search history.

(56) References Cited

U.S. PATENT DOCUMENTS

| | | | |
|---|---|---|---|
| 2009/0133906 A1 | 5/2009 | Baek | |
| 2011/0230146 A1 | 9/2011 | Morishita et al. | |
| 2016/0174364 A1* | 6/2016 | Harkness, Jr. ......... | H05K 1/111 174/257 |
| 2017/0099729 A1 | 4/2017 | Kim et al. | |
| 2017/0215273 A1 | 7/2017 | Kim et al. | |
| 2018/0053981 A1 | 2/2018 | Bae et al. | |
| 2018/0324964 A1 | 11/2018 | Yoo et al. | |
| 2019/0088388 A1* | 3/2019 | Baba ....................... | H01P 5/028 |
| 2019/0269009 A1 | 8/2019 | Park et al. | |
| 2020/0028949 A1 | 1/2020 | Kim et al. | |
| 2020/0265971 A1 | 8/2020 | Bae et al. | |
| 2020/0359493 A1 | 11/2020 | Bae et al. | |

FOREIGN PATENT DOCUMENTS

| | | |
|---|---|---|
| KR | 10-2015-0037306 A | 4/2015 |
| KR | 10-2017-0088046 A | 8/2017 |
| KR | 10-2018-0019472 A | 2/2018 |
| KR | 10-2020-0009251 A | 1/2020 |
| KR | 10-2020-0101006 A | 8/2020 |
| KR | 10-2150553 B1 | 9/2020 |
| KR | 10-2020-0129341 A | 11/2020 |
| WO | 2020/017836 A1 | 1/2020 |

OTHER PUBLICATIONS

Written Opinion of the International Searching Authority dated Mar. 31, 2021 in connection with International Patent Application No. PCT/KR2020/018880, 5 pages.

* cited by examiner

CIRCUIT BOARD AND ELECTRONIC DEVICE INCLUDING CIRCUIT BOARD

CROSS-REFERENCE TO RELATED APPLICATION

This application is based on and claims priority under 35 U.S.C. 119 to Korean Patent Application No. 10-2019-0174425 filed on Dec. 24, 2019 in the Korean Intellectual Property Office, the disclosure of which is herein incorporated by reference in its entirety.

BACKGROUND

1. Field

Various embodiments relate to a circuit board and an electronic device including the circuit board.

2. Description of Related Art

With the development of digital technology, electronic devices are being provided in various forms such as smart phones, tablet personal computers (PCs), or personal digital assistants (PDAs). An electronic device is also being developed in a form wearable on a user to improve portability and user accessibility. In accordance with the development of wireless communication technology, an electronic device (for example: a communication electronic device) is being universally used in daily life, and thus the use of content has exponentially increased. As demand for frequencies is increasing due to rapidly increasing data traffic, technology for using, for mobile communication, a high frequency band or ultrahigh frequency band (for example: millimeter wave (mmWave)) enabling easier data delivery is being steadily developed.

The above information is presented as background information only to assist with an understanding of the disclosure. No determination has been made, and no assertion is made, as to whether any of the above might be applicable as prior art with regard to the disclosure.

SUMMARY

An electronic device may include, for example, a flexible printed circuit board which electrically connects electric elements. A flexible printed circuit board may include conductive vias. A conductive via may include a conductive hole perforated so as to dispose a connection conducting wire for electrically connecting conductors disposed in different layers. When a flexible printed circuit board is disposed at an electronic device while at least a part of the flexible printed circuit board is bent, conductive vias of the bent part of the flexible printed circuit board may be damaged due to the stress caused by the bending (for example: via cracks). In addition, external electromagnetic noise (for example: electromagnetic wave noise) may affect a flexible printed circuit board used as a transmission line. In high frequency band wireless communication, the influence of external electromagnetic noise may be more sensitive. A flexible printed circuit board may include ground parts, and the ground parts may reduce the influence of external electromagnetic noise on signal lines of the flexible printed circuit board. An electric field may be produced when a current flows through signal lines of a flexible printed circuit board. Ground parts may reduce the influence of an electric field on an electric element around a flexible printed circuit board. However, due to an electric field produced by the flow of a current in a signal line, resonance between two ground parts facing each other may occur, and the resonance may cause a transmission loss. In some cases, resonance may also affect a separate electric element around a flexible printed circuit board.

Various embodiments may provide a circuit board which may be prevented from being damaged when being disposed in a bent form and may secure signal delivery reliability (for example: signal integrity) in an unfolded state or a bent state, and an electronic device including the circuit board.

According to an embodiment, an electronic device may include: a first electric element and a second electric element; and a circuit board which delivers a signal of a designated or selected frequency between the first electric element and the second electric element and includes a first portion, a second portion, and a third portion, the second and third portions extending from the first portion with the first portion therebetween, wherein the circuit board includes: at least one signal line extending from the second portion to the third portion; a plurality of ground patterns extending from the second portion to the third portion and at least partially overlapping each other; a plurality of first conductive vias positioned at the second portion and electrically connecting the plurality of ground patterns to each other; and a plurality of second conductive vias positioned at the third portion and electrically connecting the plurality of ground patterns to each other, wherein the plurality of ground patterns include a meander form at the first portion.

A circuit board according to an embodiment is provided without including a conducive via at a bending part, and thus damage such as a via crack may be preemptively prevented and reliability for bending may be thereby secured. In addition, a bending part is provided without a conductive via, and thus production costs of a circuit board may be reduced.

According to an embodiment, facing ground patterns of a circuit board are produced in a meander form, and thus resonance of a designated frequency may not occur between the ground patterns. Thus, when a signal of the designated frequency is transmitted through signal lines, the loss thereof may be prevented. In addition, a circuit board may produce impedance which is substantially constant or included in a critical range in response to a designated frequency in an unfolded state or a bent state. Therefore, reliability for signal delivery may be secured in an unfolded state or a bent state.

In addition, effects that may be obtained or predicted by various embodiments will be disclosed directly or implicitly in the detailed description of embodiments. For example, various effects predicted according to various embodiments will be disclosed in the detailed description to be described later.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
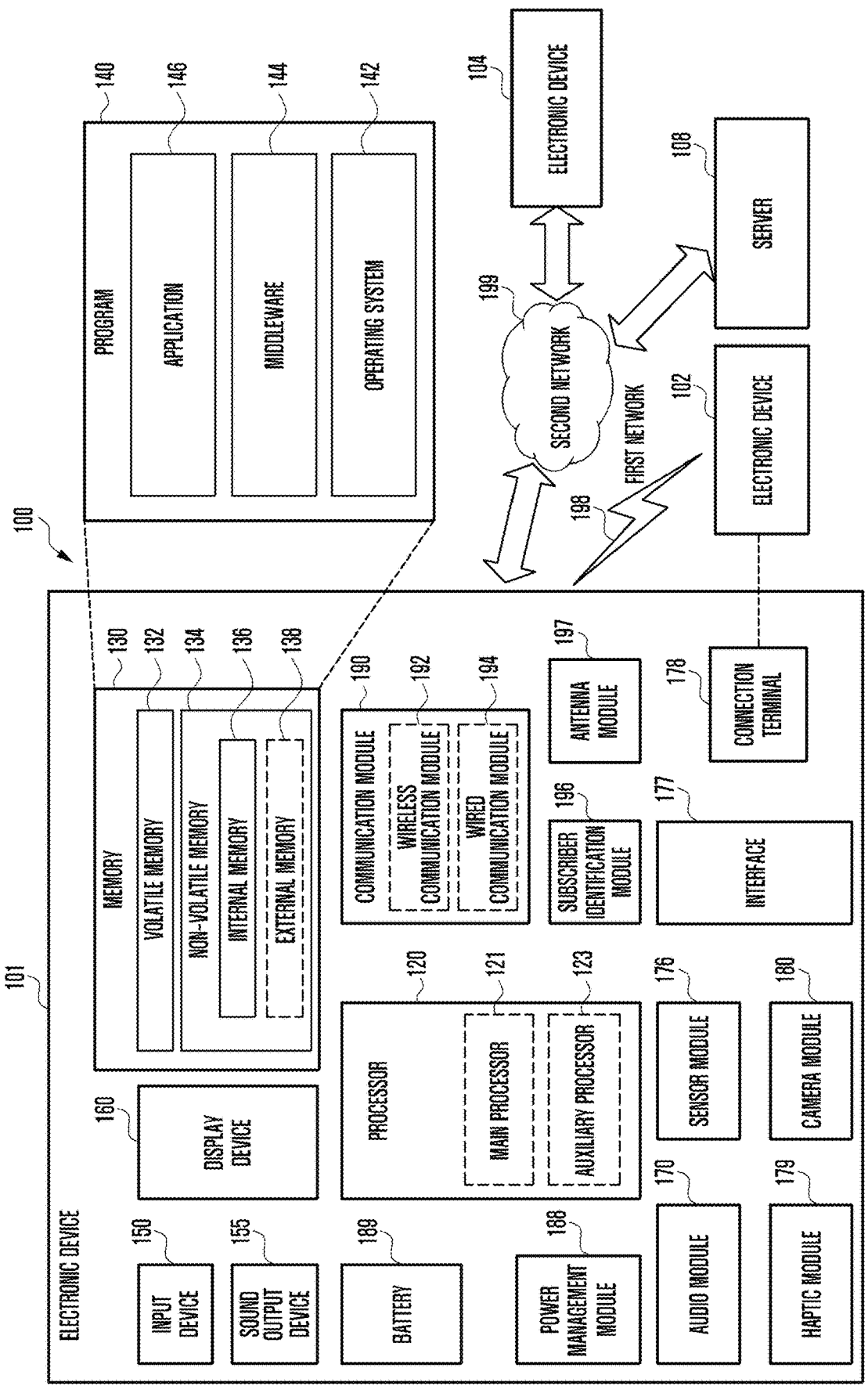
FIG. 1 illustrates a block diagram of an electronic device in a network environment, according to an embodiment of the present disclosure.

FIG. 1 illustrates an electronic device 101 in a network environment 100 according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
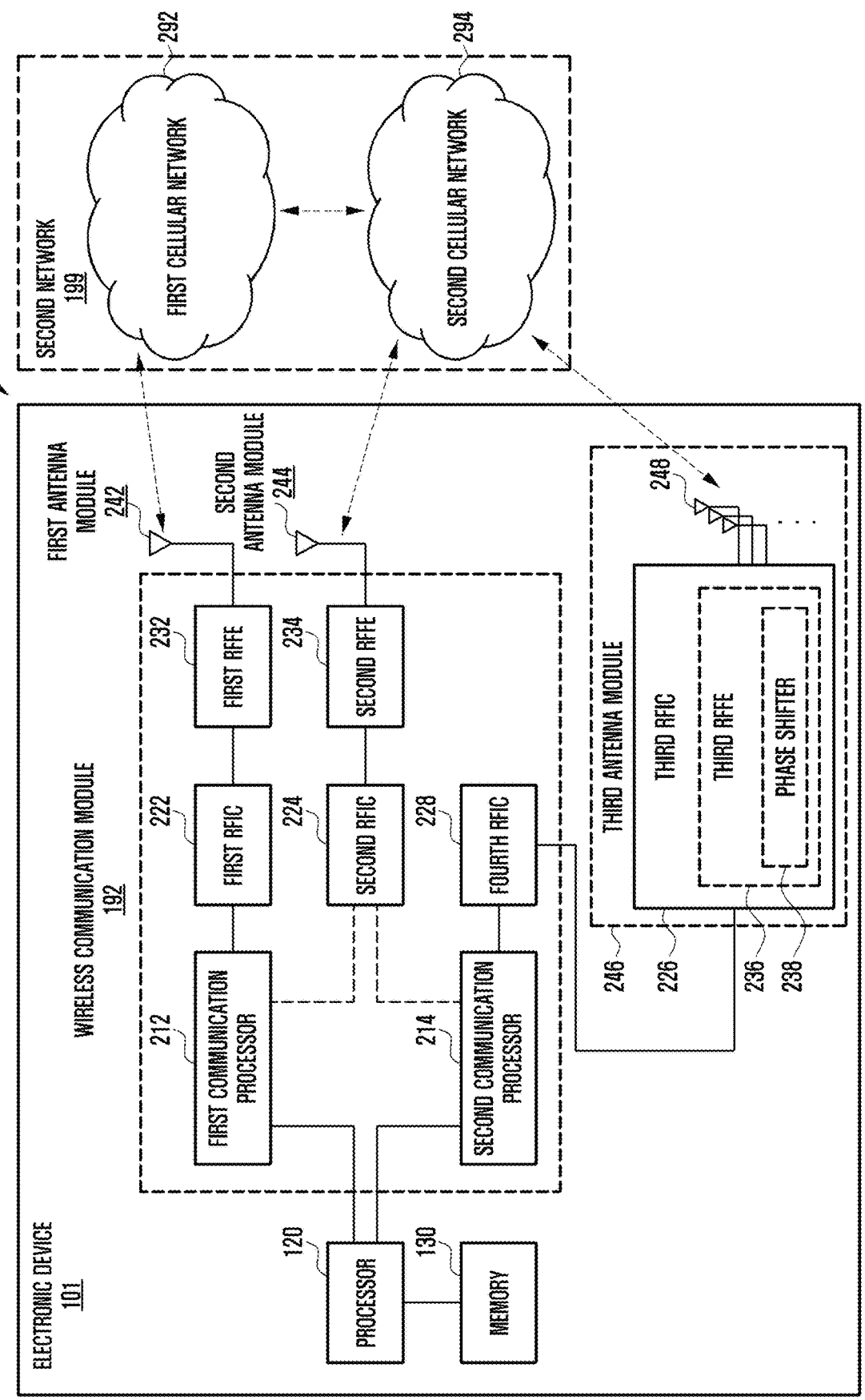
FIG. 2 illustrates a block diagram of an electronic device for supporting legacy network communication and 5G network communication, according to various embodiment of the present disclosures.

FIG. 2 is a block diagram illustrating an electronic device in a network environment including a plurality of cellular networks according to an embodiments of the disclosure.

Referring to FIG. 2, the electronic device 101 may include a first communication processor 212, second communication processor 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand-alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3:
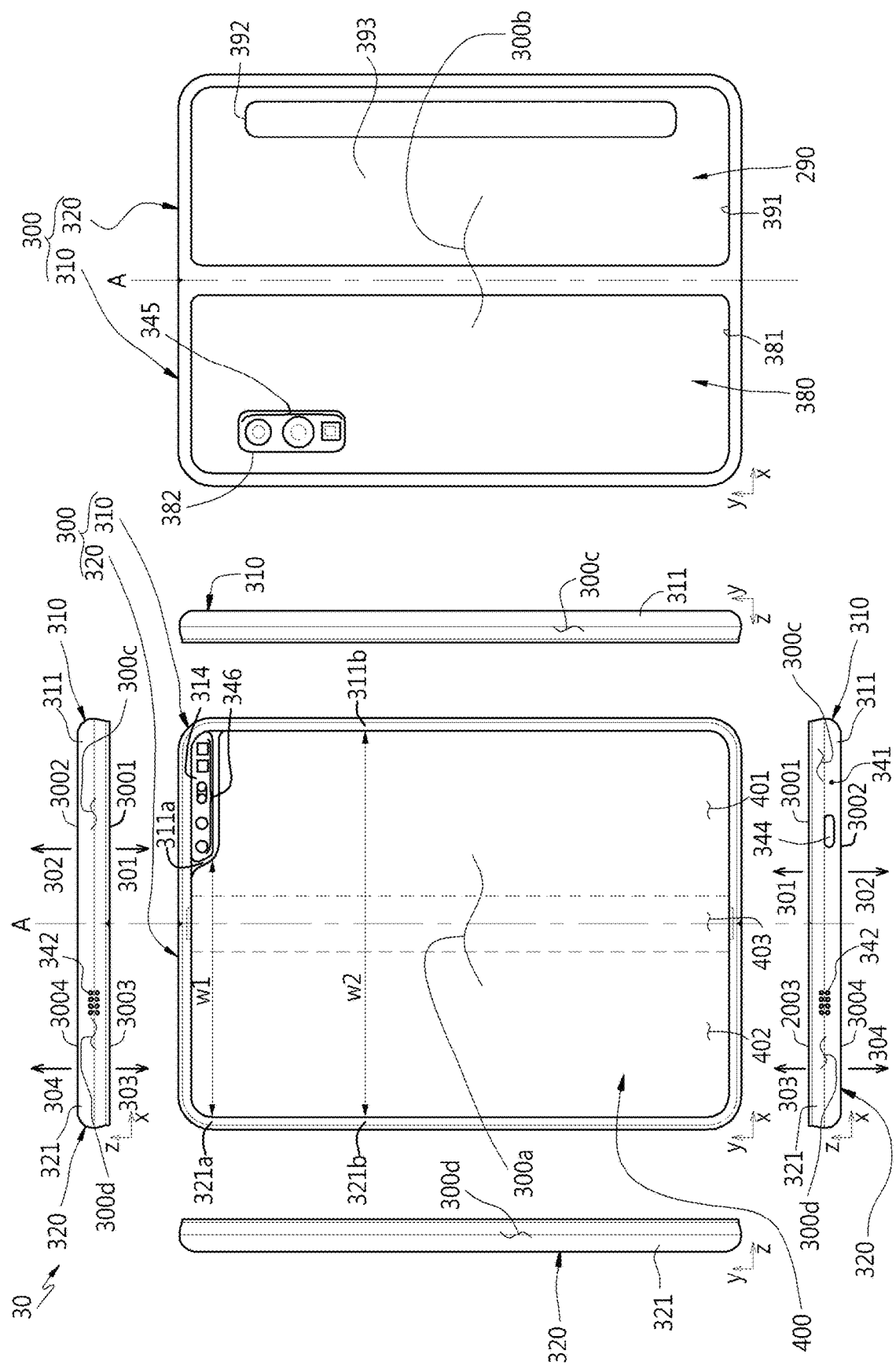
FIG. 3 illustrates an unfolded state of an electronic device, according to an embodiment of the present disclosure.
Figure 4:
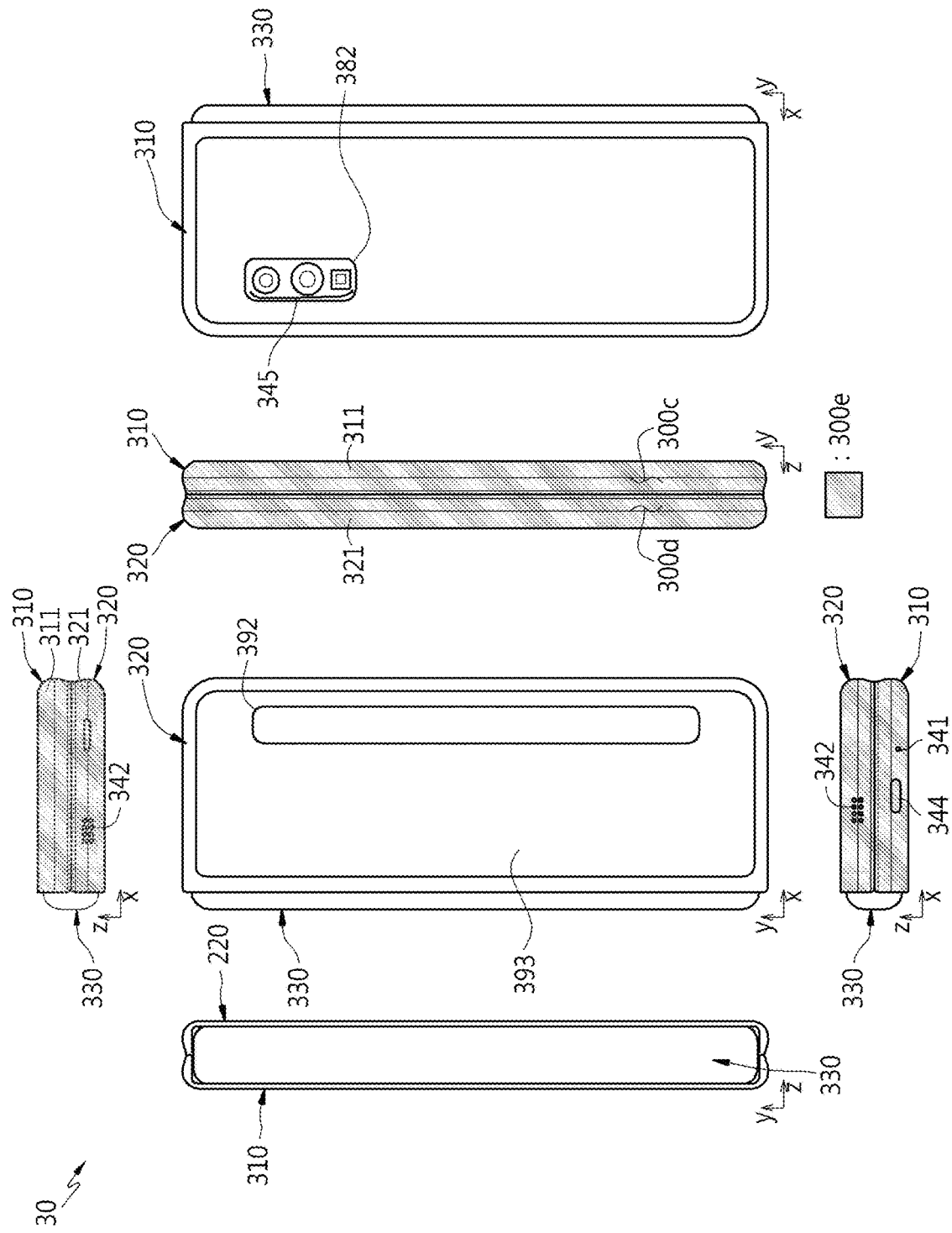
FIG. 4 illustrates a folded state of an electronic device of FIG. 3, according to an embodiment of the present disclosure.

FIG. 3 illustrates an unfolded (or flat) state of an electronic device 30, according to an embodiment of the present disclosure. FIG. 4 illustrates a folded state of an electronic device of FIG. 3, according to an embodiment of the present disclosure.

Referring to FIG. 3 and FIG. 4, in an embodiment, an electronic device 30 (for example: an electronic device 101 of FIG. 1) may include a foldable housing 300, a hinge cover 330 which covers a foldable portion of the foldable housing 300, and a flexible (or foldable) display 400 (hereinafter, simply, a display) (for example: a display device 160 of FIG. 1) which is disposed in a space produced by the foldable housing 300. According to an embodiment, a foldable housing 300 may include a front surface 300a to which a display 400 is exposed, a rear surface 300b which faces a direction opposite to the front surface 300a, and side surfaces 300c and 300d which surround a space between the front surface 300a and the rear surface 300b.

According to an embodiment, a foldable housing 300 may include a first housing structure 310 and a second housing structure 320 which are connected by a hinge structure (not shown). For example, a first housing structure 310 may be rotatably connected to a second housing structure 320 by a hinge structure.

According to an embodiment, a first housing structure 310 may include a first surface 3001 facing a first direction 301, a second surface 3002 facing a second direction 302 opposite to the first direction 301, and a first side surface 300c surrounding at least a part of a space between the first surface 3001 and the second surface 3002. A second housing structure 320 may include a third surface 3003 facing a third direction 303, a fourth surface 3004 facing a fourth direction 304 opposite to the third direction 303, and a second side surface 300d surrounding at least a part of a space between the third surface 3003 and the fourth surface 3004. A front surface 300a of an electronic device 30 may include a first surface 3001 and a third surface 3003, and a rear surface 300b of the electronic device 30 may include a second surface 3002 and a fourth surface 3004. In various embodiments (not shown), a first housing structure 310 may refer to a structure which produces a part of a first surface 3001, a second surface 3002, and a first side surface 300c. In various embodiments (not shown), a second housing structure 320 may refer to a structure which produces a part of a third surface 3003, a fourth surface 3004, and a second side surface 300d.

According to an embodiment, a foldable housing 300 may include a transparent plate (not shown) (for example: a polymer plate including various coating layers) which produces a first surface 3001 and a third surface 3003. A display 400 may be disposed along a transparent plate and may be visually exposed through a first surface 3001 and a third surface 3003. A transparent plate may have flexibility enabling an electronic device 30 to be in a folded state. According to an embodiment, a display 400 may be provided to include a transparent plate, and the transparent plate may be omitted from a foldable housing 300.

According to an embodiment, a first housing structure 310 may include a first rear surface cover 380 disposed at one side of a folding axis A and producing at least a part of a second surface 3002. For example, a first rear surface cover 380 may have a substantially rectangular periphery 381, and the periphery 381 may be surrounded by a first side surface member 311. According to various embodiments, a first side surface member 311 and a first rear surface cover 380 may be integrally produced and may include the same material.

According to an embodiment, a second housing structure 320 may include a second rear surface cover 390 disposed at a side of a folding axis A and producing at least a part of a fourth surface 3004, the side being different from the other side where a first rear surface cover 380 is disposed. For example, a second rear surface cover 390 may have a substantially rectangular periphery 391, and the periphery 391 may be surrounded by a second side surface member 321. According to various embodiments, a second side surface member 321 and a second rear surface cover 390 may be integrally produced and may include the same material.

According to various embodiments, a first rear surface cover 380 and/or a second rear surface cover 390 may be produced by, for example, coated or colored glass, ceramic, polymers, or metal (for example: aluminum, stainless steel (STS), or magnesium), or a combination of at least two among the materials.

According to an embodiment, a first rear surface cover 380 and a second rear surface cover 390 may have substantially symmetrical shapes about a folding axis A. A first rear surface cover 380 and a second rear surface cover 390 may not necessarily have mutually symmetrical shapes. In another embodiment, a first rear surface cover 380 and/or a second rear surface cover 390 which have various different shapes may be provided.

According to an embodiment, a first housing structure 310 may include a first side surface member (or a first side surface bezel structure) 311 which produces a first side surface 300c, and a second housing structure 320 may include a second side surface member (or a second side surface bezel structure) 321 which produces a second side surface 300d. A first side surface member 311 and/or a second side surface member 321 may include a metal or a polymer.

According to various embodiments, a first side surface member 311 and a second side surface member 321 may extend to produce a periphery region of a front surface 300a. For example, a front surface 300a of an electronic device 30 may be produced by a display 400, a partial region of a first side surface member 311 adjacent to the display 400, and a partial region of a second side surface member 321.

According to various embodiments, a partial region (not shown) of a first side surface member 311, the partial region being adjacent to a periphery 381 of a first rear surface cover 380, and/or a partial region (not shown) of a second side surface member 321, the partial region being adjacent to a periphery 391 of a second rear surface cover 390, may produce a part of a rear surface 300b. For example, a rear surface 300b of an electronic device 30 may be produced by a first rear surface cover 380, a partial region of a first side surface member 311 adjacent to the first rear surface cover 380, a second rear surface cover 390, and a partial region of a second side surface member 321 adjacent to the second rear surface cover 390.

According to an embodiment, a first side surface member 311 and a second side surface member 321 may be disposed on both opposite sides about a folding axis A, and may have shapes which are entirely symmetrical with respect to the folding axis A.

According to an embodiment, a first housing structure 310 may further include a component placement region 314 extending from a first side surface member 311 or combined with the first side surface member 311 to produce a first surface 3001 with a display 400. A region of a first side surface member 311 other than a component placement region 314 may have a shape mutually symmetrical to a second side surface member 321. At least one component utilizing a first surface 3001 may be disposed in a component placement region 314. According to an embodiment, a component placement region 314 may be produced to have a configured region adjacent to one corner of a first side surface member 311. According to various embodiments, the placement, shape, and size of a component placement region 314 are not limited to illustrated examples. For example, in another embodiment, a component placement region 314 may be provided at a region between a lower end corner and an upper end corner or another corner of a first side surface member 311. Components for performing various functions and embedded in an electronic device 30 may be exposed to a first surface 3001 through a component placement region 314 or one or more openings (not shown) provided in the component placement region 314. According to an embodiment, a component 346 disposed in a component placement region 314 may include at least one among various sensors such as a proximity sensor, a front surface camera, a light emitting element, or a receiver. For example, a light emitting element may provide state information of an electronic device 30 in the form of light. In another embodiment, a light emitting device may provide, for example, a light source interworking with an operation of a front surface camera. A light-emitting element may include, for example, an LED, an IR LED, and a xenon lamp.

According to an embodiment, an electronic device 30 may include at least one among audio modules (such as a microphone hole 341 and a speaker hole 342) or a connector hole 344.

According to an embodiment, an audio module may include a microphone hole 341 or a speaker hole 342. In a microphone hole 341, a microphone for acquiring an external sound may be disposed, and in an embodiment, a plurality of microphones may be disposed to detect the direction of a sound. A speaker hole 342 may include an external speaker hole or a calling receiver hole. In an embodiment, a speaker hole 342 and a microphone hole 341 may be provided as one hole, or a speaker may be included without the speaker hole 342 (for example: a piezo speaker). According to an embodiment, a connector hole 344 may include a first connector hole capable of receiving a connector (for example: a USB connector) for transmitting or receiving power and/or data to or from an external electronic device, and/or a second connector hole (for example: an earphone jack) capable of receiving a connector for transmitting or receiving an audio signal to or from an external electronic device. The position or number of connector holes is not limited to an embodiment of FIG. 3 or FIG. 4 and may be differently provided.

In various embodiments (not shown), an audio module (for example: a calling receiver), a sensor module (for example: a proximity sensor or a fingerprint sensor), a camera module (for example: a front surface camera), or a light emitting element may be included in the rear surface of a screen display region of a display 400. In another embodiment (not shown), a display 400 may be combined with or disposed adjacent to a touch detection circuit, a pressure sensor capable of measuring the intensity (pressure) of a touch, and/or a digitizer for detecting a magnetic field-type electronic pen.

According to an embodiment, a first housing structure 310 and a second housing structure 320 may together produce a recess which is a space in which a display 400 is disposed. In an illustrated embodiment, due to a component placement region 314, a recess may have two or more different widths in a direction perpendicular to a folding axis A.

For example, a recess may include a first width w1 in an x axis direction between a first portion 321a of a second side surface member 321, the first portion 321a being parallel to a folding axis A, and a first portion 311a of a first side surface member 311, the first portion 311a being produced at an periphery of a component placement region 314. A recess may include a second width w2 in an x axis direction between a second portion 321b of a second side surface member 321 and a second portion 311b of a first side surface member 311, the second portion 311b being parallel to a folding axis A while not corresponding to a component placement region 314. A second width w2 may be produced longer than a first width w1. According to an embodiment, a first portion 311a of a first housing structure 310 and a first portion 321a of a second housing structure 320, the first portions 311a and 321a having mutually asymmetrical shapes, may produce a first width w1 of a recess, and a second portion 311b of a first housing structure 310 and a second portion 321b of a second housing structure 320, the second portions 311b and 321b having mutually symmetrical shapes, may produce a second width w2 of the recess. According to an embodiment, distances from a folding axis A to a first portion 321a and a second portion 321b of a second housing structure 320 may be different. The width of a recess is not limited to illustrated examples. According to various embodiments, a recess may have a plurality of widths due to the form of a component placement region 314 or portions where a first housing structure 310 and a second housing structure 320 have asymmetrical shapes.

According to various embodiments (not shown), a display 400 may extend to a component placement region 314, and the component placement region 314 and a component 346 (for example: an optical component) disposed therein may be positioned on or near to the rear surface of the display 400. In this case, a display 400 may have a symmetrical shape with reference to a folding axis A.

According to various embodiments, one or more components may be disposed on or visually exposed to a rear surface 300b of an electronic device 30.

For example, a sub-display 393 may be visually exposed through a second rear surface cover 390. According to an embodiment, a sub-display 393 may be viewed substantially through the entire region of a second rear surface cover 390. According to an embodiment, a sub-display may be disposed to be visually exposed through a part (for example: a second rear surface region 392) of the entire region of a second rear surface cover 390.

For example, at least one component 345 may be visually exposed through a first rear surface region 382 of a first rear surface cover 380. In various embodiments, at least one component 345 may include a sensor (for example: a proximity sensor or a heart rate sensor) and/or a rear surface camera.

Referring to FIG. 4, a hinge cover 330 may be disposed between a first housing structure 310 and a second housing structure 320 and cover an internal component (for example: a hinge structure). According to an embodiment, a hinge structure may also be referred to as an element including a hinge cover 330. In an embodiment, a hinge cover 330 may be covered by a part of a first housing structure 310 and a second housing structure 320 or may be exposed to the outside according to an unfolded state or a folded state of an electronic device 30.

According to an embodiment, when an electronic device 30 is in a folded state (see FIG. 4), a first surface 3001 of a first housing structure 310 and a second surface 3002 of a second housing structure 320 may face each other. A folded state may include a fully folded state. In a fully folded state, for example, as in FIG. 4, a first surface 3001 of a first housing structure 310 and a second surface 3002 of a second housing structure 320 may make an angle of approximately 0 degrees. A folded state may further include a state where a first surface 3001 of a first housing structure 310 and a second surface 3002 of a second housing structure 320 face each other while making a narrow angle (for example: between approximately 0 degrees and 10 degrees) with respect to each other. In an embodiment, an electronic device 30 in a folded state may have a third side surface 300e having a height higher than that of the electronic device 30 in an unfolded state due to alignment of a first side surface 300c and a second side surface 300d.

According to an embodiment, an unfolded state of an electronic device 30 indicates a time when the electronic device 30 is not in a folded state, and may include a fully unfolded state or an intermediate state. In a fully unfolded state, for example, as in FIG. 3, a first surface 3001 of a first housing structure 310 and a third surface 3003 of a second housing structure 320 may make an angle of approximately 180 degrees. An intermediate state may indicate a state between a folded state and a fully unfolded state. As illustrated in FIG. 4, in a folded state, a hinge cover 330 may be exposed to the outside between a first housing structure 310 and a second housing structure 320. As illustrated in FIG. 3, in a fully unfolded state, a hinge cover 330 may be covered by a first housing structure 310 and a second housing structure 320 and thus may not be exposed. Although not illustrated, in an intermediate state, a hinge cover 330 may be partially exposed to the outside between a first housing structure 310 and a second housing structure 320. An exposed region of a hinge cover 330 in an intermediate state may be smaller than an exposed region of the hinge cover 330 in a folded state. In an embodiment, a hinge cover 330 may include a curved surface, and the curved surface may produce one side surface of an electronic device 30 in a folded state.

According to various embodiments, a foldable housing 300 may be provided in various different forms. For example, a foldable housing (not shown) may include a folding portion, a first portion, and a second portion, the first and second portions being positioned with the folding portion therebetween. A folding portion may be a portion which is bent when an electronic device is changed from an unfolded state to a folded state. According to various embodiments, a first portion may be referred to by various other terms such as a "first housing portion". A second portion may be referred to by various other terms such as a "second housing portion". A folding portion is a portion which has flexibility enabling a folded state between a first portion and a second portion, and may be referred to by various other terms. A folding portion may be provided in a structure (for example: a hinge rail or a hinge rail structure) in which a plurality of bars (or rails) extending in a y axis direction are arranged from a first portion to a second portion. According to various embodiments, a folding portion may be provided in various different structures which are bendable while connecting a first portion and a second portion. In a folded state of an electronic device, at least a part of a folding portion may have a curved shape having a curvature. According to various embodiments, a first portion and/or a second portion may refer to (a) portion(s) which is/are less flexible than a folding portion. According to various embodiments, a folding portion may be made of a material different from the material(s) of a first portion and/or a second portion.

According to various embodiments, a display 400 may mean a display in which at least a partial region may be transformed into a flat surface or curved surface. In an embodiment, referring to FIG. 3, a display 400 may include a folding portion 403, a first portion 401, and a second portion 402, wherein the first portion 401 is disposed at one side (for example: the right of the folding portion 403) with reference to the folding portion 403, and the second portion 402 is disposed at the other side (for example: the of the folding portion 403). A folding portion 403 may be a portion which is bent when an electronic device is changed from an unfolded state to a folded state.

According to various embodiments, a division of a region of a display 400, illustrated in FIG. 3, is exemplary, and a display 400 may be divided into a plurality (for example: 4 or more, or 2) regions according to a structure or a function. For example, in an embodiment illustrated in FIG. 3, a region of a display 400 may be divided by a folding portion 403 extending in parallel to a y axis or a folding axis A, but in another embodiment, a display 400 may be divided with reference to another folding portion (for example: a folding portion parallel to an x axis) or another folding axis (for example: a folding axis parallel to an x axis).

According to an embodiment, a first portion 401 and a second portion 402 of a display 400 may have entirely symmetrical shapes about a folding portion 403. According to an embodiment, unlike a first portion 401, a second portion 402 may include a notch cut according to the presence of a component placement region 314, but may have a shape symmetrical to that of the first portion 401 about a folding portion 403 in the other regions. For example, a first portion 401 and a second portion 402 may include portions having shapes symmetrical to each other about a folding portion 403 and portions having shapes asymmetrical to each other.

According to an embodiment, an angle or a distance made by a first housing structure 310 and a second housing structure 320 may vary according to an unfolded state or a folded state of a foldable housing 300. Hereinafter, each region of a display 400 and operations of a first housing structure 310 and a second housing structure 320 according to an unfolded state or a folded state of an electronic device 30 will be described.

According to an embodiment, when an electronic device 30 is in a fully unfolded state (refer to FIG. 3), a first direction 301 that a first surface 3001 of a first housing structure 310 faces and a third direction 303 that a third surface 3003 of a second housing structure 320 faces may be the same. For example, in an unfolded state, a first surface 3001 of a first housing structure 310 and a third surface 3003 of a second housing structure 320 may be disposed to face the same direction (for example: a direction that a front surface 300*a* of an electronic device 30 faces) while making an angle of approximately 180 degrees. When an electronic device 30 is in a fully unfolded state the surface of a first portion 401 and the surface of a second portion 402 of a display 400 may be disposed to face the same direction (for example: a direction that a front surface 300*a* of an electronic device 30 faces) while making an angle of approximately 180 degrees. In a fully unfolded state, a folding portion 403 of a display 400 may produce the same plane together with a first portion 401 and a second portion 402.

In an embodiment, when an electronic device 30 is in a folded state (see FIG. 4), a first housing structure 310 and a second housing structure 320 may be disposed to face each other. For example, in a folded state, a first surface 3001 of a first housing structure 310 and a third surface 3003 of a second housing structure 320 may face each other. In a folded state, the surface of a first portion 401 and the surface of a second portion 402 of a display 400 may face each other while making a narrow angle (for example: between approximately 0 degrees and 10 degrees) with respect to each other. In a folded state, at least a part of a folding portion 403 may have a curved shape having a predetermined curvature.

In an embodiment, when an electronic device 30 is in an intermediate state (not shown) between a fully unfolded state (see FIG. 3) and a folded state (see FIG. 4), a first housing structure 310 and a second housing structure 320 may be disposed at a certain angle with respect to each other. In an intermediate state, a first surface 3001 of a first housing structure 310 and a third surface 3003 of a second housing structure 320, or the surface of a first portion 401 and the surface of a second portion 402 of a display 400 may make an angle that is larger than that in a folded state and smaller than that in a fully unfolded state. In an intermediate state, at least a part of a folding portion 403 may have a curved surface having a predetermined curvature, and the curvature may be smaller than that in a folded state.

According to an embodiment, an electronic device 30 may include at least one key input device (not shown) positioned at a first side surface member 311 and/or a second side surface member 321. For example, a key input device may be provided to include a push/pull button. According to various embodiments, a key input device may be provided to include various detection elements such as a pressure sensor, a touch sensor, and an ultrasonic sensor capable of detecting a user input.

Figure 5:
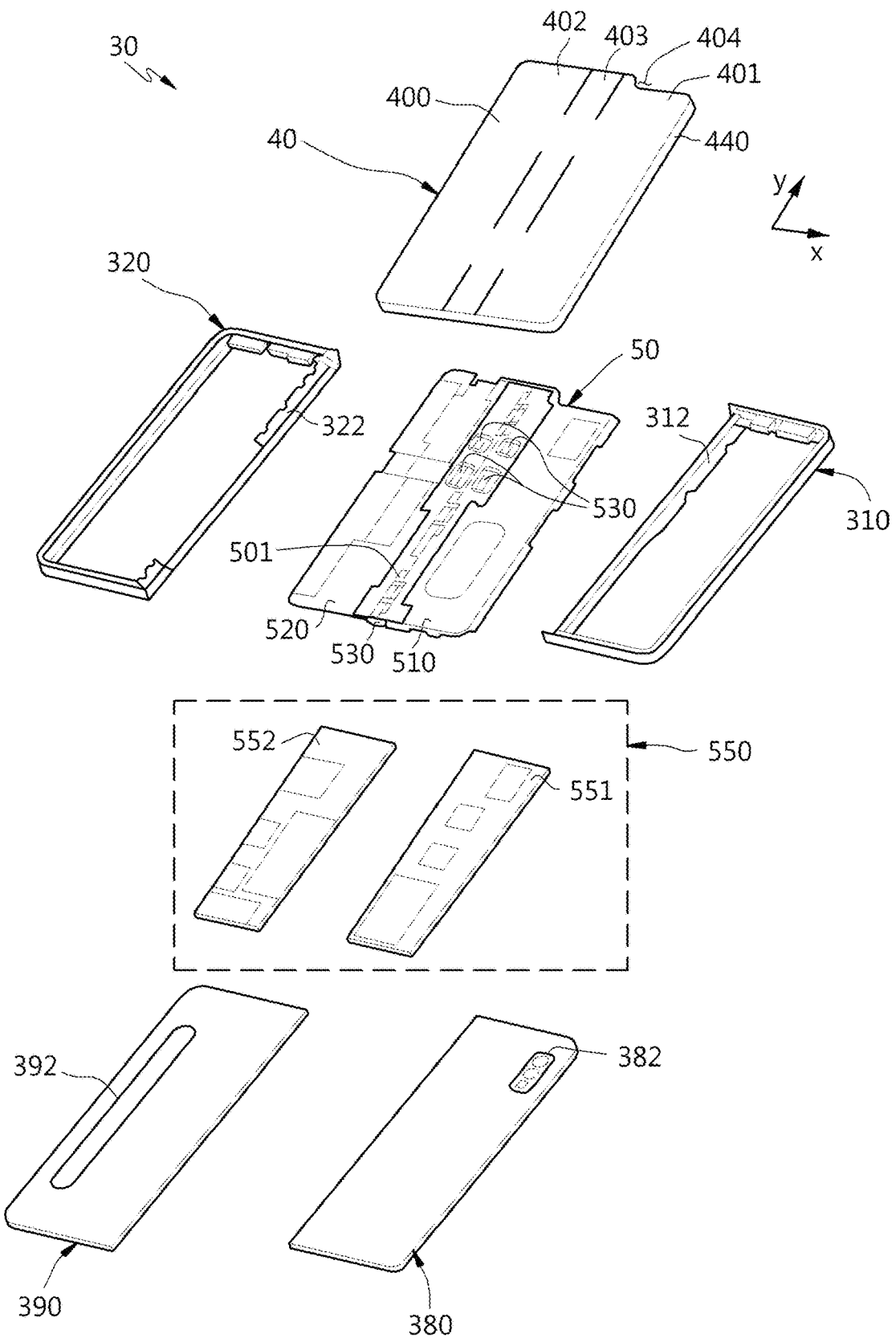
FIG. 5 illustrates a deployed perspective view of an electronic device of FIG. 3 or FIG. 4, according to an embodiment of the present disclosure.

FIG. 5 illustrates a deployed perspective view of an electronic device 30 of FIG. 3 or FIG. 4, according to an embodiment of the present disclosure.

Referring to FIG. 5, in an embodiment, an electronic device 30 may include at least one among a displayer 40, a support member assembly 50, a substrate part 550, a first housing structure 310, a second housing structure 320, a first rear surface cover 380, and a second rear surface cover 390. In this document, a displayer 40 may be referred to as a display module or a display assembly.

A displayer 40 may include, for example, a display 400 and one or more plates or layers 440 at which the display 400 stably placed. In an embodiment, a plate 440 may be disposed between a display 400 and a support member assembly 50. A display 400 may be disposed on at least a part of one surface (for example: an upper surface with reference to FIG. 5) of a plate 440. A plate 440 may be produced in a shape corresponding to that of a display 400. For example, a partial region of a plate 440 may be produced in a shape corresponding to that of a notch 404 of a display 400.

According to various embodiments (not shown), a displayer 40 may further include a digitizer for detecting an electronic pen (not shown). A digitizer may be combined with or disposed adjacent to the rear surface of a display 400.

According to an embodiment, a support member assembly 50 may include a first support member 510, a second support member 520, a hinge structure 501 disposed between the first support member 510 and the second support member 520, a hinge cover 330 for covering the hinge structure 501 when viewed from the outside, and a wiring member 530 (for example: a flexible printed circuit board (FPC)) crossing the first support member 510 and the second support member 520.

According to an embodiment, a support member assembly 50 may be disposed between a plate 440 and a substrate part 550. For example, a first support member 510 may be disposed between a first portion 401 of a display 400 and a first substrate (for example: a first printed circuit board (PCB)) 551. A second support member 520 may be disposed between a second portion 402 of a display 400 and a second substrate (for example: a second printed circuit board) 552.

According to an embodiment, at least a part of a hinge structure 501 and a wiring member 530 may be disposed in a support member assembly 50. A wiring member 530 may be disposed in a direction (for example: an x axis direction) crossing a first support member 510 and a second support member 520. A wiring member 530 may be disposed in a direction (for example: an x axis direction) perpendicular to a folding axis (for example: a y axis or a folding axis A of FIG. 3) of a folding portion 403 of a display 400. A wiring member 530 may electrically connect a first substrate 551 and a second substrate 552. A hinge structure 501 may enable a support member assembly 50 to be in an unfolded state or a folded state, while connecting a first support member 510 and a second support member 520.

According to various embodiments, a hinge structure 501 may be provided in various folding structures enabling a folded state between a first support member 510 and a second support member 520. According to an embodiment, a folding structure may be provided in various forms which are bendable while connecting a first support member 510 and a second support member 520. A folding structure, as a portion having flexibility enabling a folded state between a first support member 510 and a second support member 520, may be referred to by various other terms according to the structure thereof. According to various embodiments, when an electronic device 30 is in a folded state, a folding structure between a first support member 510 and a second support member 520 may have a curved shape. According to various embodiments, a first support member 510 and/or a second support member 520 may indicate (a) portions which is/are less flexible than a folding structure. According to various embodiments, a folding portion may be made of the same material as the material(s) of a first support member 510 and/or a second support member 520, or a material different from the material(s) of the first support member 510 and/or the second support member 520.

According to an embodiment, a substrate part 550 may include a first substrate 551 disposed at a first support member 510 side and a second substrate 552 disposed at a second support member 520 side. A first substrate 551 and a second substrate 552 may be disposed in a space produced by a support member assembly 50, a first housing structure 310, a second housing structure 320, a first rear surface cover 380, and a second rear surface cover 390. Components for providing various functions of an electronic device 30 may be disposed at a first substrate 551 and a second substrate 552.

According to an embodiment, a first housing structure 310 and a second housing structure 320 may be assembled to each other to be coupled to both opposite sides of a support member assembly 50 in a state where a displayer 40 is coupled to the support member assembly 50. According to various embodiments, a first housing structure 310 and a second housing structure 320 may be slid at both opposite sides of a support member assembly 50 to be coupled to the support member assembly 50.

In an embodiment, a first housing structure 310 may include a first rotation support surface 312, and a second housing structure 320 may include a second rotation support surface 322 corresponding to the first rotation support surface 312. A first rotation support surface 312 and a second rotation support surface 322 may include curved surfaces corresponding to a curved surface included in a hinge cover 330.

In an embodiment, when an electronic device 30 is in an unfolded state (see FIG. 3), a first rotation support surface 312 and a second rotation support surface 322 may cover a hinge cover 330, and the hinge cover 330 may not be exposed to or may be minimally exposed to the rear surface of an electronic device 30. When an electronic device 30 is in a folded state (refer to FIG. 4), a hinge cover 330 may be maximally exposed between a first rotation support surface 312 and a second rotation support surface 322.

Figure 6:
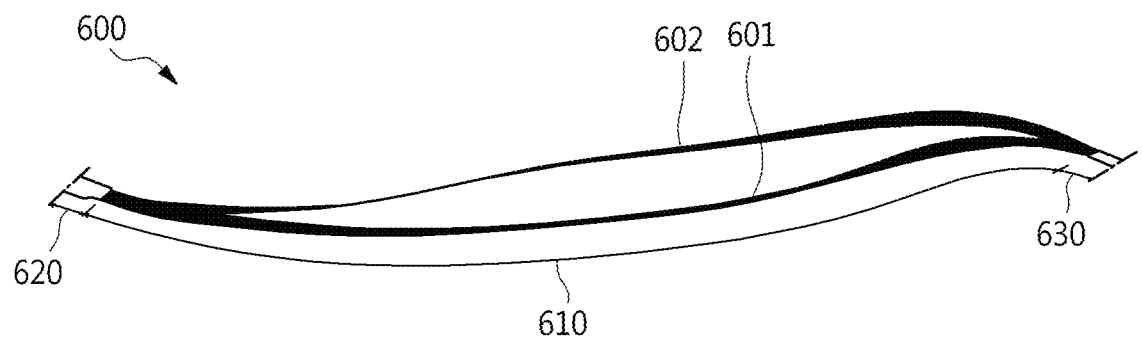
FIG. 6 illustrates a circuit board according to an embodiment of the present disclosure.

FIG. 6 illustrates a circuit board 600 according to an embodiment of the present disclosure.

Referring to FIG. 6, in an embodiment, a circuit board (or a circuit substrate) 600 may include a first portion 610, a second portion 620, or a third portion 630. A first portion 610 may be positioned between a second portion 620 and a third portion 630. A second portion 620 and a third portion 630 may extend from a first portion 610 with the first portion 610 therebetween. A circuit board 600 may include at least one dielectric body, at least one signal line, and a plurality of ground patterns extending from a second portion 620 to a third portion 630.

According to an embodiment, a first portion 610 may be flexible, and a second portion 620 and/or a third portion 630 may be less flexible than the first portion 610 or may be more rigid than the first portion 610. According to various embodiments, a first portion 610 may have a thickness thinner than that of a second portion 620 and/or a third portion 630, or a smaller number of stacks, and thus may be more flexible than the second portion 620 and/or the third portion 630. According to various embodiments, a first portion 610, as a flexible section in a circuit board 600, may be referred to by various other terms such as a "first section". A second portion 610, as a rigid section in a circuit board 600, may be referred to by various other terms such as a "second section". A third portion 630, as a rigid section in a circuit board 600, may be referred to by various other terms such as a "third section". According to various embodiments, a circuit board 600 may be referred to as a flexible printed circuit board. According to an embodiment, a circuit board 600 may be referred to as a rigid flexible printed circuit board.

According to various embodiments, a wiring member 530 of FIG. 5 may include at least a part of a circuit board 600. Referring to FIG. 2 and FIG. 6, a second portion 620 may be positioned in a first housing structure (or a first housing portion) 210, and a third portion 630 may be positioned in a second housing structure (or a second housing portion) 220. A first portion 610 may be positioned in a foldable housing 300 and may be disposed across a first housing structure 210 and a second housing structure 220. According to an embodiment, a first portion 610 may be positioned to at least partially overlap a hinge structure 501 of FIG. 5. A first portion 610 may be unfolded in an unfolded state (see FIG. 3) of a foldable housing 300, or may be bent in a folded state (see FIG. 4) of the foldable housing 300. Referring to FIG. 5 and FIG. 6, in an embodiment, a first substrate 551 and a second substrate 552 may be electrically connected through a circuit board 600.

According to an embodiment, a circuit board 600 may be used as a transmission line in an antenna device (or an antenna system). A transmission line, as a structure for transmitting a frequency signal (a voltage or a current), may be a conductor system which uses a wave transmission action by an electric parameter (resistance per unit length, inductance, conductance, or capacitance).

In various embodiments, referring to FIG. 2 and FIG. 6, a third antenna module 246 and a fourth RFIC 228 may exchange a signal of a designated or selected frequency through a circuit board 600. For example, a signal may include a radio frequency (RF) signal or an intermediate (IF) signal. For example, a designated or selected frequency may include approximately 6-100 GHz.

According to an embodiment, a second portion 620 of a circuit board 600 may be electrically connected to a transmitter, and a third portion 630 of the circuit board 600 may be electrically connected to a receiver. A transmitter, as a master integrated circuit (IC), may include, for example, a processor 120 and/or a wireless communication module 192 of FIG. 1. A receiver, as a slave IC, may include elements or modules (for example: an antenna module 197 of FIG. 1) connected to a master IC and exchanging a frequency signal.

According to various embodiments, a circuit board 600 may be positioned at various different electronic devices. For example, a circuit board 600 may be positioned at an electronic device (not shown) having an out-folding structure in which a screen is folded outward, without being limited to an electronic device (for example: an electronic device 30 of FIG. 3) provided in an in-folding structure in which a screen is folded inward. For another example, a circuit board 600 may be positioned in a bent form in various forms of electronic devices (not shown) such as a bar type.

According to an embodiment, a circuit board 600 may include a first layer 601 and a second layer 602 which extend from a second portion 620 to a third portion 630. One end (not shown) of a first layer 601 and one end (not shown) of a second layer 602 may be combined at a second portion 620, and the other end (not shown) of the first layer 601 and the other end (not shown) of the second layer 602 may be combined at a third portion 630. According to an embodiment, a first layer 601 and a second layer 602 may be positioned to be separated from a first portion 610. The separation of a first layer 601 and a second layer 602 at a first portion 610 may indicate a state where the first layer 601 and the second layer 602 are not bonded. A gap between a first layer 601 and a second layer 602 may differ according to an unfolded state or a bent state of a first portion 610. For example, a gap between a first layer 601 and a second layer 602 may be larger in an unfolded state than in a bent state of a first portion 610. According to various embodiments, a gap between a first layer 601 and a second layer 602 may also differ according to a degree of bending of a first portion 610. In some cases, when a first portion 610 is bent, a first layer 601 and a second layer 602 may physically come into contact with each other at least partially. The separation of a first layer 601 and a second layer 602 at a first portion 610 may enhance flexibility of a first portion 610.

According to various embodiments, a circuit board 600 may be provided in a form in which three or more layers are separated from a first portion 610, without being limited to an embodiment of FIG. 6.

According to various embodiments (not shown), a circuit board 600 may further include a fourth portion or a fifth portion extending from a second portion 620 (or a third portion 630). A fourth portion may be positioned between a second portion 620 (or a third portion 630) and a fifth portion. A fourth portion may be produced substantially in the same manner as that for a first portion 610 and may be flexible. A fifth portion may be produced substantially in the same manner as that for a second portion 620 (or a third portion 630), and may be more rigid than a fourth portion.

According to various embodiments (not shown), a circuit board 600 may include a first connector positioned at a second portion 620 or a second connector positioned at a third portion 630. A first connector may be electrically connected to a first electric element, and a second connector may be electrically connected to a second electric element.

Figure 7A:
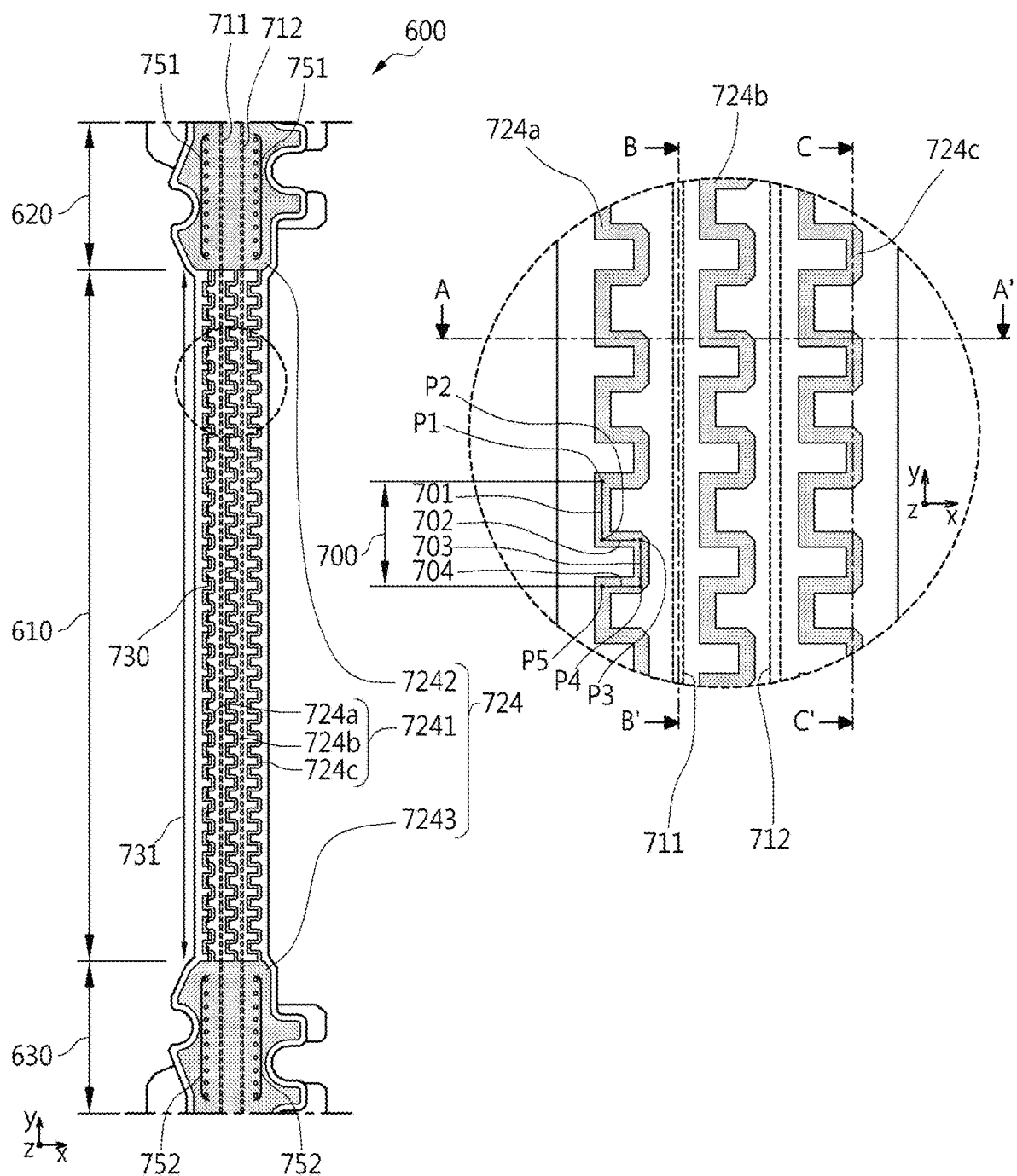
FIG. 7A illustrates a plane view of a unfolded state of a circuit board of FIG. 6, according to an embodiment of the present disclosure.
Figure 8:
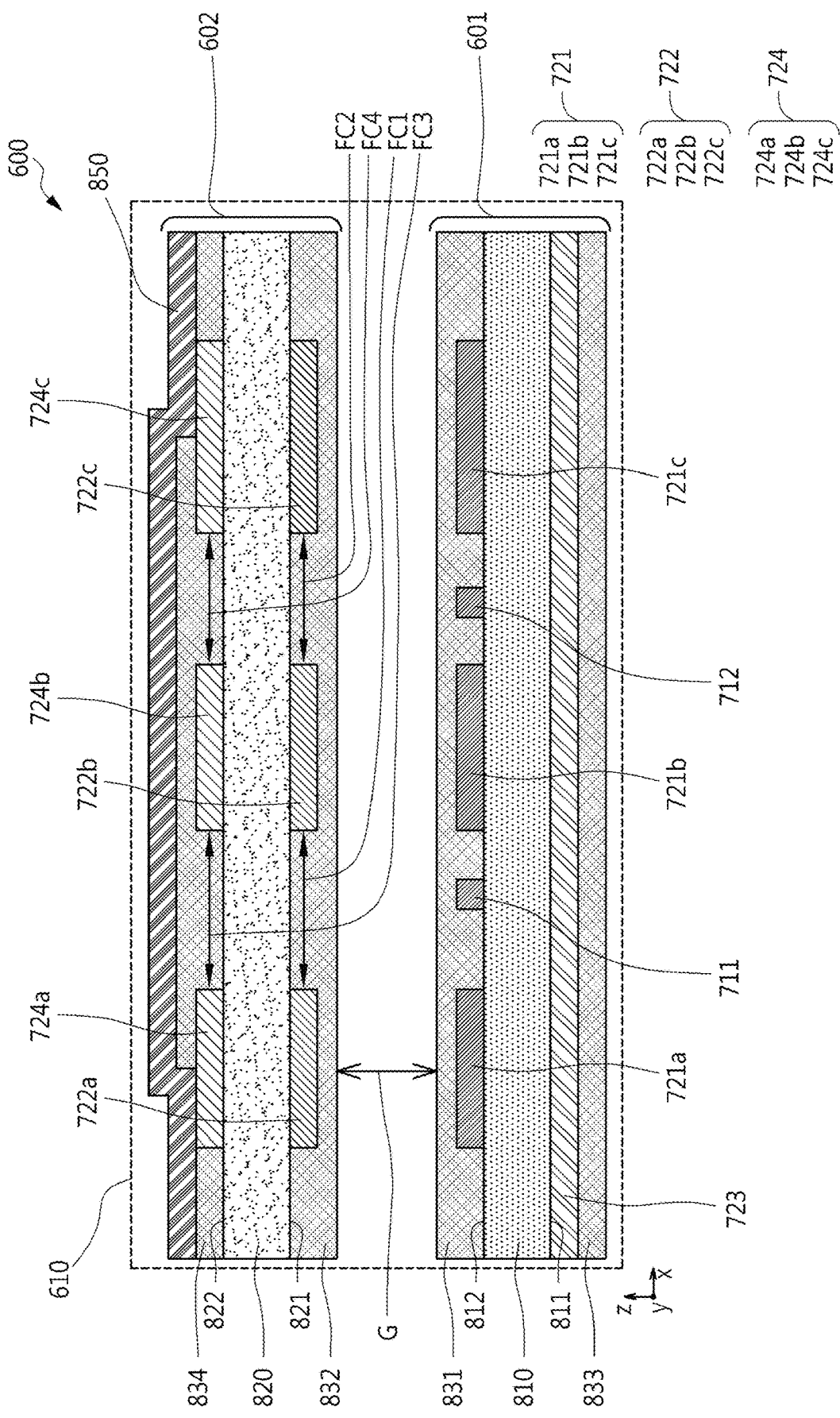
FIG. 8 illustrates a cross-sectional view for an A-A' line in a circuit board of FIG. 7A, according to an embodiment of the present disclosure.

FIG. 7A illustrates a plane view of a unfolded state of a circuit board of FIG. 6, according to an embodiment of the present disclosure. FIG. 8 illustrates a cross-sectional view for an A-A' line in a circuit board of FIG. 7A, according to an embodiment of the present disclosure.

Referring to FIG. 7A and FIG. 8, in an embodiment, a circuit board 600 may include a plurality of signal lines 711 and 712 extending from a second portion 620 to a third portion 630. A circuit board 600 may include a plurality of ground patterns (or ground parts) 721, 722, 723, and 724 extending from a second portion 620 to a third portion 630. A circuit board 600 may include a first layer 601 and a second layer 602 extending from a second portion 620 to a third portion 630. A first layer 601 and a second layer 602 may be separated from each other at a first portion 610 between a second portion 620 and a third portion 630. According to an embodiment, a plurality of signal lines 711 and 712 may be positioned at a first layer 601. According to an embodiment, a first ground pattern 721 and a third ground pattern 723 may be positioned at a first layer 601. According to an embodiment, a second ground pattern 722 and a fourth ground pattern 724 may be positioned at a second layer 602.

According to various embodiments, a first portion 610 may extend in a linear form as illustrated in FIG. 7A between a second portion 620 and a third portion 630, but is not limited thereto. At least a part of a first portion 610 may be provided in various forms such as a curved shape or a bent form according to a region in which a circuit board 600 is to be positioned in an electronic device (for example: an electronic device 30 of FIG. 3).

Referring to FIG. 8, in an embodiment, a first layer 601 may include a first insulation layer 810, a plurality of signal lines 711 and 712, a first ground pattern 721, or a third ground pattern 723. A first insulation layer 810 may include a second surface 812 facing a second layer 602 and a first surface 811 facing the opposite to the second surface 812. A plurality of signal lines 711 and 712 and a first ground pattern 721 may be disposed on a second surface 812, and a third ground pattern 723 may be disposed on a first surface 811. A first layer 601 may be produced based on a flexible copper clad laminate (FCCL) (or an original plate).

For example, a flexible copper clad laminate, as a laminate used in a printed circuit, may include a structure in which copper foil is adhered to one side surface or both side surfaces of an insulation layer including a base material (for example: resin) and a binder as a variety of insulation materials. An insulation layer (for example: a first insulation layer 810) of a flexible copper clad laminate may be made of various dielectric bodies such as a flexible polyester film or a polyimide film. A circuit board 600 may be produced through a series of flows including, for example, circuit printing, etching, and resist stripping, based on a flexible copper clad laminate. By circuit printing, a circuit pattern may be printed on a flexible copper clad laminate. By etching, a portion of copper foil, the portion corresponding to a circuit pattern, may remain. By resist stripping, an inner layer (or an inner layer substrate) to which a circuit (for example: a plurality of signal lines 711 and 712, a first ground pattern 721, or a third ground pattern 723) is coupled may be produced at an insulation layer (for example: a first insulation layer 810). Copper foil of a flexible copper clad laminate may be, for example, electrolytic copper foil produced by a chemical-electrolysis reaction. When copper foil is produced, in order to enhance adhesion between copper foil and a resin of an insulation layer, the copper foil may be made to react chemically with a resin to partially penetrate into the resin (for example: approximately 5 um (micrometer)). The thickness of electrolytic copper foil may be approximately 18-70 um, but copper foil may be produced in various thinner thicknesses such as approximately 5 um, 7 um, or 15 um according to a condition such as wiring density or size reduction. According to an embodiment, copper foil of a flexible copper clad laminate may be rolled copper foil made to be thin by rolling copper. The thickness of copper foil included in a flexible copper clad laminate may be variously produced according to a current allowed in signal lines 711 and 712 of a circuit board 600. According to various embodiments, a flexible copper clad laminate for producing a circuit board 600 may be made of a material capable of responding to high speed signal transmission, and may include, for example, a flexible copper clad laminate for a high frequency. For example, the lower a dielectric constant of an insulation layer (for example: a first insulation layer 810) included in a flexible copper clad laminate is, the higher propagation speed a circuit board 600 provided based on a flexible copper clad laminate may support through signal lines 711 and 712.

According to an embodiment, based on a flexible copper clad laminate having a structure in which copper foil is attached to one side surface of an insulation layer, an inner layer including a first insulation layer 810, a plurality of signal lines 711 and 712, and a first ground pattern 721 may be produced. In this case, an outer layer including a third ground pattern 723 may be bonded to the inner layer through a prepreg having functions such as adhesion and insulation.

According to an embodiment, a second layer 602 may include a second insulation layer 820, a second ground pattern 722, or a fourth ground pattern 724. A second insulation layer 820 may include a third surface 821 facing a first layer 601 and a fourth surface 822 facing the opposite to the third surface 821. A second ground pattern 722 may be disposed on a third surface 821, and a fourth ground pattern 724 may be disposed on a fourth surface 822. A second layer 602 may be provided substantially in the same manner as that for a first layer 601, based on a flexible copper clad laminate. According to various embodiments, a flexible copper clad laminate utilized for a second layer 602 may be at least partially the same as or different from a flexible copper clad laminate utilized for a first layer 601. According to various embodiments, a second insulation layer 820 may have substantially the same dielectric constant as that of a first insulation layer 810, or may have a dielectric constant different from that of the first insulation layer 810. According to various embodiments, the thickness (for example: a height in a z axis direction) of a second insulation layer 820 may be substantially the same as or different from the thickness of a first insulation layer 810.

Referring to FIG. 7A, for understanding, a fourth ground pattern 724 is shaded. A fourth ground pattern (or a fourth ground part) 724 may include a first conductor 7241 positioned at a first portion 610 of a circuit substrate 600, a second conductor 7242 positioned at a second portion 620, or a third conductor 7243 positioned at a third portion 630. According to an embodiment, a first conductor 7241 may include a first conductive pattern 724a, a second conductive pattern 724b, or a third conductive pattern 724c connecting a second conductor 7242 and a third conductor 7243. When viewed in a z axis direction, a second conductive pattern 724b may be positioned between a first conductive pattern 724a and a third conductive pattern 724c.

Referring to FIG. 7A and FIG. 8, in an embodiment, a second ground pattern 722 may be produced to at least partially overlap a fourth ground pattern 724 when viewed in a z axis direction. For example, a second ground pattern 722 may include a first conductor (not shown) positioned at a first portion 610 of a circuit board 600, a second conductor (not shown) positioned at a second portion 620 of the circuit board 600, or a third conductor (not shown) positioned at a third portion 630 of the circuit board 600. When viewed in a z axis direction, a first conductor of a second ground pattern 722 may at least partially overlap a first conductor 7241 of a fourth ground pattern 724. According to an embodiment, a first conductor of a second ground pattern 722 may be produced substantially in the same form as that of a first conductor 7241 of a fourth ground pattern 724. For example, when viewed in a z axis direction, a first conductor of a second ground pattern 722 may include a first conductive pattern 722a overlapping a first conductive pattern 724a of a fourth ground pattern 724, a second conductive pattern 722b overlapping a second conductive pattern 724b of the fourth ground pattern 724, or a third conductive pattern 722c overlapping a third conductive pattern 724c of the fourth ground pattern 724. When viewed in a z axis direction, a second conductor of a second ground pattern 722 may at least partially overlap a second conductor 7242 of a fourth ground pattern 724. When viewed in a z axis direction, a third conductor of a second ground pattern 722 may at least partially overlap a third conductor 7243 of a fourth ground pattern 724.

Referring to FIG. 7A and FIG. 8, in an embodiment, a first ground pattern 721 may be produced to at least partially overlap a second ground pattern 722 and/or a fourth ground pattern 724 when viewed in a z axis direction. For example, a first ground pattern 721 may include a first conductor (not shown) positioned at a first portion 610 of a circuit board 600, a second conductor (not shown) positioned at a second portion 620 of the circuit board 600, or a third conductor (not shown) positioned at a third portion 630 of the circuit board 600. When viewed in a z axis direction, a first conductor of a first ground pattern 721 may at least partially overlap a first conductor of a second ground pattern 722 and/or a first conductor 7241 of a fourth ground pattern 724. According to an embodiment, a first conductor of a first ground pattern 721 may be produced substantially in the same form as that of a first conductor of a second ground pattern 722 and/or a first conductor 7241 of a fourth ground pattern 724. For example, when viewed in a z axis direction, a first conductor of a first ground pattern 721 may include a first conductive pattern 721a overlapping a first conductive pattern 724a of a fourth ground pattern 724, a second conductive pattern 721b overlapping a second conductive pattern 724b of the fourth ground pattern 724, or a third conductive pattern 721c overlapping a third conductive pattern 724c of the fourth ground pattern 724. When viewed in a z axis direction, a second conductor of a first ground pattern 721 may at least partially overlap a second conductor 7242 of a fourth ground pattern 724. When viewed in a z axis direction, a third conductor of a first ground pattern 721 may at least partially overlap a third conductor 7243 of a fourth ground pattern 724.

Referring to FIG. 7A and FIG. 8, when viewed in a z axis direction, a plurality of signal lines 711 and 712 may not substantially overlap a first ground pattern 721, a second ground pattern 722, and/or a fourth ground pattern 724 at a first portion 610 of a circuit board 600. For example, when viewed in a z axis direction, a first signal line 711 may be positioned between a first conductive pattern 721a and a second conductive pattern 721b of a first ground pattern 721 at a first portion 610 of a circuit board 600. For example, when viewed in a z axis direction, a second signal line 712 may be positioned between a second conductive pattern 721b and a third conductive pattern 721c of a first ground pattern 721 at a first portion 610 of a circuit board 600. For example, when viewed in a z axis direction, a first signal line 711 may be positioned between a first conductive pattern 722a and a second conductive pattern 722b of a second ground pattern 722 at a first portion 610 of a circuit board 600. For example, when viewed in a z axis direction, a second signal line 712 may be positioned between a second conductive pattern 722b and a third conductive pattern 722c of a second ground pattern 722 at a first portion 610 of a circuit board 600. For example, when viewed in a z axis direction, a first signal line 711 may be positioned between a first conductive pattern 723a and a second conductive pattern 723b of a third ground pattern 723 at a first portion 610 of a circuit board 600. For example, when viewed in a z axis direction, a second signal line 712 may be positioned between a second conductive pattern 723b and a third conductive pattern 723c of a third ground pattern 723 at a first portion 610 of a circuit board 600. According to an embodiment, when viewed in a z axis direction, a plurality of signal lines 711 and 712 may at least partially overlap a first ground pattern 721, a second ground pattern 722, a third ground pattern 723, and/or a fourth ground pattern 724 at a second portion 620. According to an embodiment, when viewed in a z axis direction, a third ground pattern 723 may be produced to at least partially overlap a circuit (for example: a plurality of signal lines 711 and 712 and a first ground pattern 721) disposed on a second surface 812 of a first layer 601.

Referring to FIG. 7A and FIG. 8, in an embodiment, a circuit board 600 may include a plurality of first conductive vias 751 produced at a second portion 620. A conductive via may include a conductive hole perforated so as to dispose a connection conductor for electrically connecting conductors disposed in different layers. A first ground pattern 721, a second ground pattern 722, a third ground pattern 723, and a fourth ground pattern 724 may be electrically connected through a plurality of first conductive vias 751 at a second portion 620 of a circuit board 600. In an embodiment, a circuit board 600 may include a plurality of second conductive vias 752 produced at a third portion 630. A first ground pattern 721, a second ground pattern 722, a third ground pattern 723, and a fourth ground pattern 724 may be electrically connected through a plurality of second conductive vias 752 at a second portion 620 of a circuit board 600. First, second, third, and fourth ground patterns 721, 722, 723, and 724 and first and second conductive vias 751 and 752 electrically connecting the ground patterns may produce a ground structure having a corresponding potential. A ground structure and a plurality of signal lines 711 and 712 may not be short-circuited, and thus a signal transmitted through a plurality of signal lines 711 and 712 may be maintained. A ground structure may produce a shielding structure which at least partially surrounds a first signal line 711, thereby reducing electromagnetic interference (EMI) with respect to the first signal line 711. A ground structure may produce a shielding structure which at least partially surrounds a second signal line 712, thereby reducing electromagnetic interference with respect to the second signal line 712. A ground structure may reduce electromagnetic interference with respect to a plurality of signal lines 711 and 712, and may reduce a loss of a signal having a designated or selected frequency (for example: a frequency signal) transmitted through the plurality of signal lines 711 and 712. For example, a ground structure may reduce the influence of external electromagnetic noise on a plurality of signal lines 711 and 712. For example, when a current flows through a plurality of signal lines 711 and 712, an electric field may be produced, and a ground structure may reduce the influence of the electric field on an electric element around a circuit board 600. According to various embodiments (not shown), the number or position of signal lines may vary without being limited to an embodiment of FIG. 7A or FIG. 8, and a ground structure may be provided accordingly.

Referring to FIG. 7A and FIG. 8, in an embodiment, since a first portion 610 does not include a conductive via (or a structure short-circuiting ground patterns in a z axis direction), damage such as a via crack with respect to the bending of the first portion 610 may be preemptively prevented, and thus reliability for the bending may be thereby secured. In addition, a first portion 610 is provided without a conductive via, and thus production costs of a circuit board 600 may be reduced. A second portion 620 and a third portion 630 include a plurality of conductive vias, and thus may be more rigid than a first portion 610.

Referring to FIG. 7A, in an embodiment, a plurality of first conductive vias 751 may be positioned dividedly at both opposite sides with a plurality of signal lines 711 and 712 therebetween at a second portion 620 of a circuit board 600 when viewed in a z axis direction. A plurality of second conductive vias 752 may be positioned dividedly at both opposite sides with a plurality of signal lines 711 and 712 therebetween at a third portion 630 of a circuit board 600 when viewed in a z axis direction. According to various embodiments, the position or number of conductive vias at a second portion 620 or a third portion 630 of a circuit board 600 may vary without being limited to an embodiment of FIG. 7A.

Referring to FIG. 8, in an embodiment, a first layer 601 may include a first nonconductive material 831 which at least partially covers a plurality of signal lines 711 and 712 and a first ground pattern 721. A plurality of signal lines 711 and 712 and a first ground pattern 721 are not exposed to the outside by a first nonconductive material 831, and thus oxidation thereof may be prevented. A first nonconductive material 831 may prevent a short circuit of a plurality of signal lines 711 and 712 and a first ground pattern 721 disposed on a second surface 812 and a second ground pattern 722 of a second layer 602.

According to an embodiment, a second layer 602 may include a second nonconductive material 832 which at last partially covers a second ground pattern 722. A second ground pattern 722 is not exposed to the outside by a second nonconductive material 832, and thus oxidation thereof may be prevented. A second nonconductive material 832 may prevent a short circuit of a second ground pattern 722 disposed on a third surface 821 and a plurality of signal lines 711 and 712 or a first ground pattern 721 of a first layer 601.

According to an embodiment, a first layer 601 may include a third nonconductive material 833 which at least partially covers a third ground pattern 723. At least a part of a third ground pattern 723 is not exposed to the outside by a third nonconductive material 833, and thus oxidation thereof may be prevented. A third nonconductive material 833 may prevent a short circuit of a third ground pattern 723 disposed on a first surface 811 and another metal body around a circuit board 600.

According to an embodiment, a second layer 602 may include a fourth nonconductive material 834 which at least partially covers a fourth ground pattern 724. At least a part of a fourth ground pattern 724 is not exposed to the outside by a fourth nonconductive material 834, and thus oxidation thereof may be prevented. A fourth nonconductive material 834 may prevent a fourth ground pattern 724 disposed on a fourth surface 822 from being electrically connected to another metal body around a circuit board 600.

According to various embodiments, a first nonconductive material 831, a second nonconductive material 832, a third nonconductive material 833, or a fourth nonconductive material 834 may include various insulation materials or dielectric bodies.

Referring to FIG. 7A, in an embodiment, a first portion 610, a second portion 620, and a third portion 630 of a circuit board 600 may produce impedance which is substantially the same or is included in a threshold range. Impedance matching between a first portion 610, a second portion 620, and a third portion 630 may reduce a power loss and/or a transmission loss when a signal having a designated or selected frequency is transmitted through a plurality of signal lines 711 and 712. Signal integrity may be secured due to impedance matching between a first portion 610, a second portion 620, and a third portion 630.

Referring to FIG. 8, in an embodiment, a gap G (for example: an air gap) between a first layer 601 and a second layer 602 at a first portion 610 may vary according to an unfolded state or a bent state of the first portion 610. For example, a gap G between a first layer 601 and a second layer 602 at a first portion 610 may be smaller in a bent state than in an unfolded state of the first portion 610. A gap G between a first layer 601 and a second layer 602 at a first portion 610 may also vary according to a degree of bending of the first portion 610. According to an embodiment, a first portion 610 may produce impedance, which is substantially constant or is included in a threshold range, in response to a designated frequency in an unfolded state or a bent state. Therefore, reliability for signal delivery may be secured in an unfolded state or a bent state of a first portion 610.

According to an embodiment, even when a first portion 610 is transformed from an unfolded state to a bent state or from a bent state to an unfolded state, a spacing distance of a plurality of signal lines 711 and 712 at a first portion 610 from a first ground pattern 721 and a third ground pattern 723 may not change. When a first portion 610 is transformed from an unfolded state to a bent state or from a bent state to an unfolded state, a spatial positional relationship (for example: a spacing distance) between a plurality of signal lines 711 and 712 of a first layer 601 and a second ground pattern 722 of a second layer 602 may vary. According to an embodiment, a circuit board 600 may include a first fill-cut FC1 between a first conductive pattern 722a and a second conductive pattern 722b of a second ground pattern 722. A first fill-cut FC1 may be defined as a portion produced such that a second ground pattern 722 does not at least partially overlap a first signal line 711 when viewed in a z axis direction. When a first portion 610 is transformed from an unfolded state to a bent state or from a bent state to an unfolded state, a first fill-cut FC1 may reduce the impedance influence of a second ground pattern 722 at the first portion 610 on a first signal line 711. A second ground pattern 722 may be produced not to extend to a first fill-cut FC1, and thus the impedance influence of the second ground pattern 722 on a first signal line 711 in an unfolded state or a bent state of a first portion 610 may be reduced. According to an embodiment, a circuit board 600 may include a second fill-cut FC2 between a second conductive pattern 722b and a third conductive pattern 722c of a second ground pattern 722. A second fill-cut FC2 may be defined as a portion produced such that a second ground pattern 722 does not at least partially overlap a second signal line 712 when viewed in a z axis direction. When a first portion 610 is transformed from an unfolded state to a bent state or from a bent state to an unfolded state, a second fill-cut FC2 may reduce the impedance influence of a second ground pattern 722 at the first portion 610 on a second signal line 712. A second ground pattern 722 may be produced not to extend to a second fill-cut FC2, and thus the impedance influence of the second ground pattern 722 on a second signal line 712 in an unfolded state or a bent state of a first portion 610 may be reduced.

According to an embodiment, when a first portion 610 is transformed from an unfolded state to a bent state or from a bent state to an unfolded state, a spatial positional relationship (for example: a spacing distance) between a plurality of signal lines 711 and 712 and a fourth ground pattern 724 at the first portion 610 may vary. According to an embodiment, a circuit board 600 may include a third fill-cut FC3 between a first conductive pattern 724a and a second conductive pattern 724b of a fourth ground pattern 724. A third fill-cut FC3 may be defined as a portion produced such that a fourth ground pattern 724 does not at least partially overlap a first signal line 711 when viewed in a z axis direction. When a first portion 610 is transformed from an unfolded state to a bent state or from a bent state to an unfolded state, a third fill-cut FC3 may reduce the impedance influence of a fourth ground pattern 724 at the first portion 610 on a first signal line 711. A fourth ground pattern 724 may be produced not to extend to a third fill-cut FC3, and thus the impedance influence of the fourth ground pattern 724 on a first signal line 711 in an unfolded state or a bent state of a first portion 610 may be reduced. According to an embodiment, a circuit board 600 may include a fourth fill-cut FC4 between a second conductive pattern 724b and a third conductive pattern 724c of a fourth ground pattern 724. A fourth fill-cut FC4 may be defined as a portion produced such that a fourth ground pattern 724 does not at least partially overlap a second signal line 712 when viewed in a z axis direction. When a first portion 610 is transformed from an unfolded state to a bent state or from a bent state to an unfolded state, a fourth fill-cut FC4 may reduce the impedance influence of a fourth ground pattern 724 at the first portion 610 on a second signal line 712. A fourth ground pattern 724 may be produced not to extend to a fourth fill-cut FC4, and thus the impedance influence of the fourth ground pattern 724 on a second signal line 712 in an unfolded state or a bent state of a first portion 610 may be reduced.

According to an embodiment, when a first portion 610 is transformed from an unfolded state to a bent state or from a bent state to an unfolded state, a gap G between a first layer 601 and a second layer 602 at a first portion 610 may vary, but due to a first fill-cut FC1, a second fill-cut FC2, a third fill-cut FC3, or a fourth fill-cut FC4, the first layer 601 at the first portion 610 may produce impedance, which is substantially constant or is included in a threshold range, corresponding to a designated frequency. Due to a first fill-cut FC1, a second fill-cut FC2, a third fill-cut FC3, or a fourth fill-cut FC4, a second layer 602 at a first portion 610 may not substantially affect impedance of a first layer 601. A second layer 602 at a first portion 610 may affect impedance of a first layer 601, but due to a first fill-cut FC1, a second fill-cut FC2, a third fill-cut FC3, or a fourth fill-cut FC4, impedance of the first layer 601 may be included in a threshold range. According to an embodiment, due to a first fill-cut FC1, a second fill-cut FC2, a third fill-cut FC3, or a fourth fill-cut FC4, impedance of a first layer 601 at a first portion 610 may be substantially determined by a plurality of signal lines 711 and 712, a first ground pattern 721, a third ground pattern 723, and a first insulation layer 810 having a dielectric constant in an unfolded state or a bent state of the first portion 610.

According to an embodiment (not shown), in consideration of impedance influence or electromagnetic interference on a plurality of signal lines 711 and 712, a fourth ground pattern 724 may extend to a third fill-cut FC3 and/or a fourth fill-cut FC4.

According to an embodiment, a first portion 610 may include a first shielding member 850 positioned at a second layer 602 to face a fourth surface 822. A first shielding member 850 may include various materials capable of shielding electromagnetic noise, and may be, for example, an EMI sheet. A first ground pattern 721, a second ground pattern 722, or a fourth ground pattern 724 may be positioned between a third ground pattern 723 and a first shielding member 850. A first ground pattern 721, a second ground pattern 722, a third ground pattern 723, a fourth ground pattern 724, and a first shielding member 850 may produce a shielding structure at a first portion 610. A shielding structure may reduce electromagnetic interference (EMI) with respect to a plurality of signal lines 711 and 712, and thus signal integrity may be secured. For example, a third ground pattern 723 of a shielding structure may reduce or shield external electromagnetic noise applied to a first surface 811 side of a first layer 601. For example, a first shielding member 850 of a shielding structure may reduce or shield external electromagnetic noise applied to a fourth surface 822 side of a second layer 602.

According to an embodiment, a first shielding member 850 may be electrically connected to a fourth ground pattern 724. For example, a first shielding member 850 and a fourth ground pattern 724 may be short-circuited through a portion where a fourth nonconductive material 834 does not cover the fourth ground pattern 724.

According to an embodiment, at a first portion 610, a first conductive pattern 721a of a first ground pattern 721 and a first conductive pattern 722a of a second ground pattern 722 may at least partially overlap each other when viewed in a z axis direction. At a first portion 610, a second conductive pattern 721b of a first ground pattern 721 and a second conductive pattern 722b of a third ground pattern 722 may at least partially overlap each other when viewed in a z axis direction. At a first portion 610, a third conductive pattern 721c of a first ground pattern 721 and a third conductive pattern 722c of a second ground pattern 722 may at least partially overlap when viewed in a z axis direction. Accordingly, a circuit board 600 may have a shielding structure capable of reducing electromagnetic interference with respect to a plurality of signal lines 711 and 712, while improving space efficiency.

Referring to FIG. 7A and FIG. 8, in an embodiment, a first portion 610 of a circuit board 600 does not include a conductive via which short-circuits first, second, third, and fourth ground patterns 721, 722, 723, and 724, and thus a transmission loss or electromagnetic interference with respect to a plurality of signal lines 711 and 712 may substantially occur at a first portion 610 rather than at a second portion 620 or a third portion 630. In addition, a first portion 610 of a circuit board 600 does not include a conductive via which short-circuiting first, second, third, and fourth ground patterns 721, 722, 723, and 724, and thus resonance between the first, second, third, and fourth ground patterns 721, 722, 723, and 724 at the first portion 610 is likely to occur due to an electric field produced by the flow of a current in a plurality of signal lines 711 and 712. For example, resonance is likely to occur between a first conductive pattern 721a of a first ground pattern 721 and a first conductive pattern 722a of a second ground pattern 722, the conductive patterns facing each other. For example, resonance is likely to occur between a second conductive pattern 721b of a first ground pattern 721 and a second conductive pattern 722b of a second ground pattern 722, the conductive patterns facing each other. For example, resonance is likely to occur between a third conductive pattern 721c of a first ground pattern 721 and a third conductive pattern 722c of a second ground pattern 722, the conductive patterns facing each other. For example, resonance is likely to occur between a first conductive pattern 722a of a second ground pattern 722 and a first conductive pattern 724a of a fourth ground pattern 724, the conductive patterns facing each other. For example, resonance is likely to occur between a second conductive pattern 722b of a second ground pattern 722 and a second conductive pattern 724b of a fourth ground pattern 724, the conductive patterns facing each other. For example, resonance is likely to occur between a third conductive pattern 722c of a second ground pattern 722 and a third conductive pattern 724c of a fourth ground pattern 724, the conductive patterns facing each other. When a signal of a designated or selected frequency is transmitted through a plurality of signal lines 711 and 712, if resonance occurs between first, second, third, and fourth ground patterns 721, 722, 723, and 724 at a designated or selected frequency, the resonance may cause a transmission loss (for example: a signal leakage). In some cases, resonance between first, second, third, and fourth ground patterns 721, 722, 723, and 724 may also affect a separate electric element around a circuit board 600. According to an embodiment, when a signal of a designated or selected frequency is transmitted through a plurality of signal lines 711 and 712, first, second, third, or fourth ground patterns 721, 722, 723, or 724 may be produced in various forms so as to prevent the occurrence of resonance of a designated or selected frequency between the first, second, third, and fourth ground patterns 721, 722, 723, and 724. A third ground pattern 723 should shield external electromagnetic noise applied to a first surface 811 of a first layer 601, and thus may be substantially disposed, for example, along most of the first surface 811, and thus the form thereof may be limited compared to a first, second, or fourth ground pattern 721, 722, or 724.

Referring to FIG. 8, in an embodiment, a first conductive pattern 721a of a first ground pattern 721 and a first conductive pattern 722a of a second ground pattern 722 may be produced in a meander form, the conductive patterns facing each other at a first portion 610 of a circuit board 600. A second conductive pattern 721b of a first ground pattern 721 and a second conductive pattern 722b of a second ground pattern 722 may be produced in a meander form, the conductive patterns facing each other at a first portion 610 of a circuit board 600. A third conductive pattern 721c of a first ground pattern 721 and a third conductive pattern 722c of a second ground pattern 722 may be produced in a meander form, the conductive patterns facing each other at a first portion 610 of a circuit board 600. A first conductive pattern 722a of a second ground pattern 722 and a first conductive pattern 724a of a fourth ground pattern 724 may be produced in a meander form, the conductive patterns facing each other at a first portion 610 of a circuit board 600. A second conductive pattern 722b of a second ground pattern 722 and a second conductive pattern 724b of a fourth ground pattern 724 may be produced in a meander form, the conductive patterns facing each other at a first portion 610 of a circuit board 600. A third conductive pattern 722c of a second ground pattern 722 and a third conductive pattern 724c of a fourth ground pattern 724 may be produced in a meander form, the conductive patterns facing each other at a first portion 610 of a circuit board 600. A meander form may include a series of sinuous curves, bends, loops, turns, or windings.

Referring to FIG. 7A, in an embodiment, a first conductive pattern 724a, a second conductive pattern 724b, or a third conductive pattern 724c of a fourth ground pattern 724 may be produced in a corrugated strip structure (or a conductive line). For example, a first conductive pattern 724a of a fourth ground pattern 724 may include a meander form in which a plurality of strips 700 including a first strip 701, a second strip 702, a third strip 703, or a fourth strip 704 are arranged between a second portion 620 and a third portion 630 and are connected to each other. A first strip 701 may extend from a first position P1 to a second position P2. A second strip 702 may extend from a second position P2 to a third position P3. A third strip 703 may extend from a third position P3 to a fourth position P4. A fourth strip 704 may extend from a fourth position P4 to a fifth position P5. A first strip 701 and a third strip 703 may be substantially parallel. A first strip 701 may be perpendicular to a second strip 702. A second strip 702 and a fourth strip 704 may be substantially parallel.

According to an embodiment, a first conductive pattern 724a, a second conductive pattern 724b, and a third conductive pattern 724c of a fourth ground pattern 724 may have substantially the same meander form. According to various embodiments (not shown), at least two among a first conductive pattern 724a, a second conductive pattern 724b, and a third conductive pattern 724c may be produced in different meander forms.

Referring to FIG. 8, in an embodiment, a first conductive pattern 722a of a second ground pattern 722 may be produced in a meander form based on a strip 700 of FIG. 7A, and may overlap an entire first conductive pattern 724a of a fourth ground pattern 724 when viewed in a z axis direction. A first conductive pattern 722a of a second ground pattern 722 and a first conductive pattern 724a of a fourth ground pattern 724 may contribute to a shielding structure which may minimize electromagnetic interference with respect to a plurality of signal lines 711 and 712, while enhancing space efficiency.

According to various embodiments, when viewed in a z axis direction, a first conductive pattern 722a of a second ground pattern 722 may be produced to at least partially overlap a first conductive pattern 724a of a fourth ground pattern 724. For example, a first conductive pattern 722a of a second ground pattern 722 may be produced in a meander form based on a strip 700 of FIG. 7A, and may be positioned to partially overlap a first conductive pattern 724a of a fourth ground pattern 724 when viewed in a z axis direction. For another example, a first conductive pattern 722a of a second ground pattern 722 may be produced in a meander form which is at least partially different from a first conductive pattern 724a of a fourth ground pattern 724.

According to an embodiment, a second conductive pattern 722b of a second ground pattern 722 and a second conductive pattern 724b of a fourth ground pattern 724, the conductive patterns being spaced apart from each other while facing each other, may be produced substantially in the same manner as a first conductive pattern 722a of the fourth ground pattern 724 and a first conductive pattern 724a of the fourth ground pattern 724. A third conductive pattern 722c of a second ground pattern 722 and a third conductive pattern 724c of a fourth ground pattern 724, the conductive patterns being spaced apart from each other while facing each other, may be produced substantially in the same manner as a first conductive pattern 722a of a second ground pattern 722 and a first conductive pattern 724a of the fourth ground pattern 724.

According to an embodiment, a first conductive pattern 721a of a first ground pattern 721 and a first conductive pattern 722a of a second ground pattern 722, the conductive patterns being spaced apart from each other while facing each other, may be produced substantially in the same manner as a first conductive pattern 722a of the second ground pattern 722 and a first conductive pattern 724a of a fourth ground pattern 724. A second conductive pattern 721b of a first ground pattern 721 and a second conductive pattern 722b of a second ground pattern 722, the conductive patterns being spaced apart from each other while facing each other, may be produced substantially in the same manner as a first conductive pattern 722a of the second ground pattern 722 and a first conductive pattern 724a of a fourth ground pattern 724. A third conductive pattern 721c of a first ground pattern 721 and a third conductive pattern 722c of a second ground pattern 722, the conducive patterns being spaced apart from each other while facing each other, may be produced substantially in the same manner as a first conductive pattern 722a of the second ground pattern 722 and a first conductive pattern 724a of a fourth ground pattern 724.

Figure 7B:
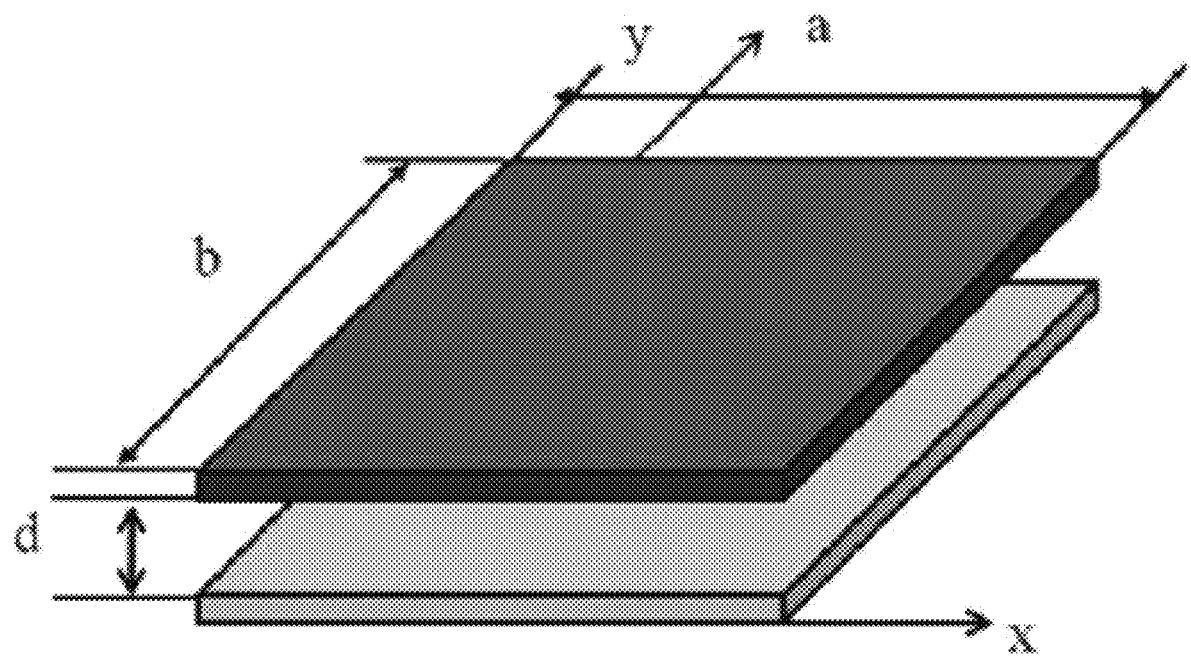
FIG. 7B illustrates two conductive plates spaced apart from each other while facing each other according to an embodiment of the present disclosure.

A frequency at which resonance occurs between two conductive plates spaced apart from each other while facing each other may be based on, for example, equation (1) below and FIG. 7B.

$$k^2 = k_x^2 + k_y^2 \text{: derived from Helm-holtz equation} \qquad [\text{Equation (1)}]$$

$$k_x = \frac{m\pi}{a}, k_y = \frac{n\pi}{b} \text{: wave generation condition}$$

$$f_{mn} = \frac{c}{2\pi\sqrt{\varepsilon_r}} \sqrt{\left(\frac{m\pi}{a}\right)^2 + \left(\frac{n\pi}{b}\right)^2} \text{ : cut off frequency}$$

Referring to equation 1 above, a frequency at which resonance occurs between two conductive plates spaced apart from each other while facing each other may vary according to the length (a or b) of the conductive plates. For example, as the length (a or b) of two conductive plates increases, a frequency at which resonance between the conductive plates occurs may decrease. For example, as the length (a or b) of two conductive plates decreases, a frequency at which resonance between the conductive plates occurs may increase. A frequency at which resonance between two conductive plates occurs may be referred to as a cut off frequency as a boundary at which a signal, when flowing through a signal line (for example: a first signal line 711 or a second signal line 712 of FIG. 7A), is lost or does not substantially flow through the signal line. Referring to FIG. 7A and FIG. 8, for example, when comparing a first case where a first conductive pattern 724a of a fourth ground pattern 724 and a first conductive pattern 722a of a second ground pattern 722 are provided in a meander form and a second case (reference sign 730) where the conductive patterns are provided in a straight line form, not a meander form, a frequency at which resonance between the first conductive patterns 722a and 724a occurs may be lower in the first case than in the second case. According to the characteristic (for example: straightness) of a wave (for example: a sine wave), a first length of a first strip 701 or a third strip 703 of a strip 700 may affect resonance between the first conductive patterns 722a and 724a in the first case, and a second length 731 longer than the first length may affect resonance between the first conductive patterns 722a and 724a in the second case. Compared to the second case, resonance is made to occur at a high frequency in the first case, and thus a frequency of a signal transmittable through a plurality of signal lines 711 and 712 while reducing a power loss and/or a transmission loss may be more various in the first case than in the second case. A comparison related to a loss between the first case and the second case will be described later with reference to FIG. 11. A comparison related to interference (isolation) between the first case and the second case will be described later with reference to FIG. 12.

According to various embodiments (not shown), in consideration of impedance or electromagnetic interference, a plurality of signal lines 711 and 712 may be positioned on a third surface 821 of a second layer 602. For example, a first signal line 711 may be disposed on a third surface 821 between a first conductive pattern 722a and a second conductive pattern 722b of a second ground pattern 722. For example, a second signal line 712 may be disposed on a third surface 821 between a second conductive pattern 722b and a third conductive pattern 722c of a second ground pattern 722.

According to various embodiments (not shown), in consideration of impedance or electromagnetic interference, a plurality of signal lines 711 and 712 may be positioned on a fourth surface 822 of a second layer 602. For example, a first signal line 711 may be disposed on a fourth surface 822 between a first conductive pattern 724a and a second conductive pattern 724b of a fourth ground pattern 724. For example, a second signal line 712 may be disposed on a fourth surface 822 between a second conductive pattern 724b and a third conductive pattern 724c of a fourth ground pattern 724.

According to various embodiments (not shown), in consideration of impedance or electromagnetic interference, a first signal line 711 may be disposed on a third surface 821 between a first conductive pattern 722a and a second conductive pattern 722b of a second ground pattern 722. In consideration of impedance or electromagnetic interference, a second signal line 712 may be disposed on a fourth surface 822 between a second conductive pattern 724b and a third conductive pattern 724c of a fourth ground pattern 724.

According to various embodiments (not shown), in consideration of impedance or electromagnetic interference, a second signal line 712 may be disposed on a third surface 821 between a second conductive pattern 722b and a third conductive pattern 722c of a second ground pattern 722.

According to various embodiments (not shown), in consideration of impedance or electromagnetic interference, a second signal line 712 may be disposed on a fourth surface 822 between a second conductive pattern 724b and a third conductive pattern 724c of a fourth ground pattern 724.

Figure 9:
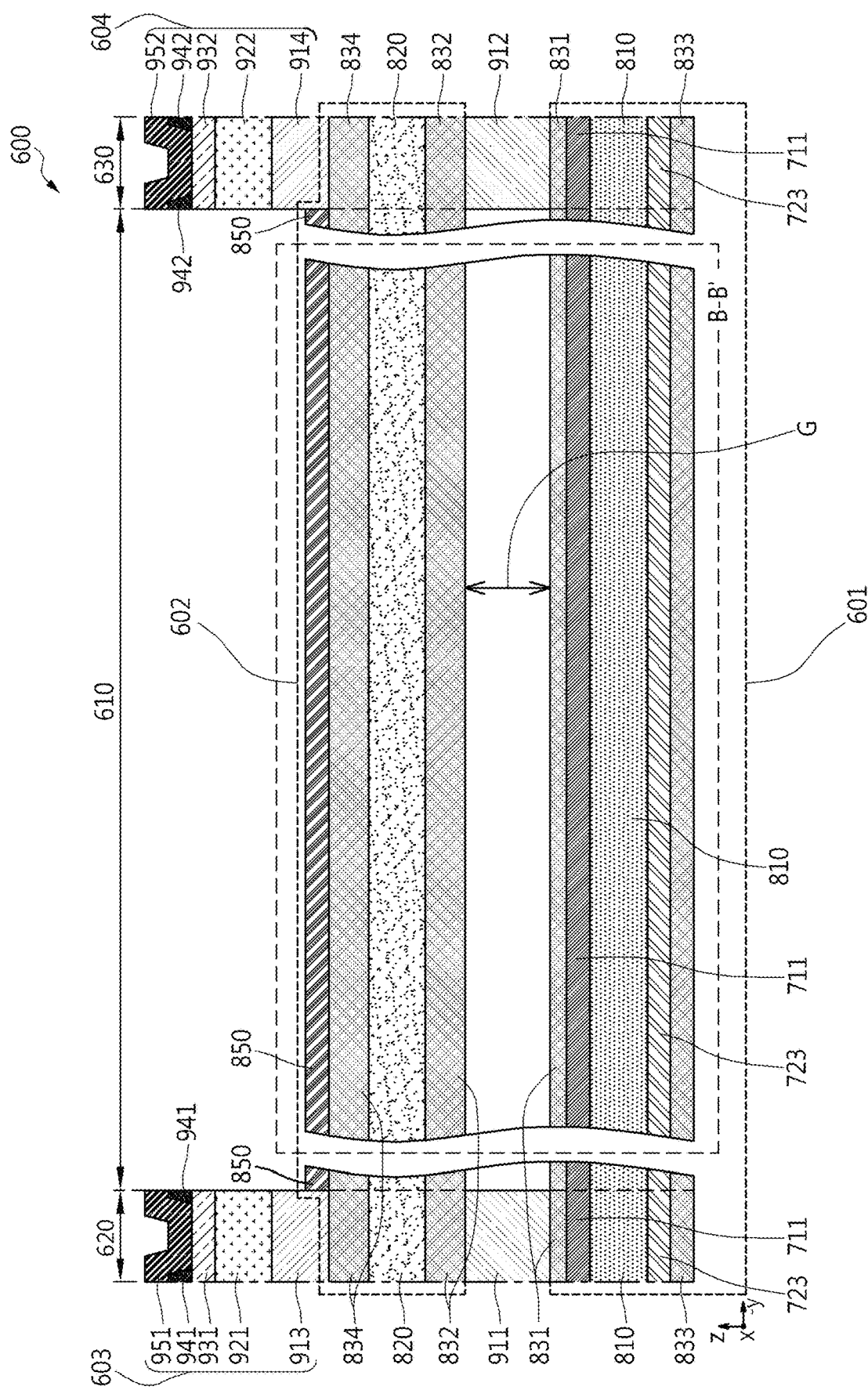
FIG. 9 illustrates a cross-sectional view for a B-B' line in a circuit board of FIG. 7A, according to an embodiment of the present disclosure.
Figure 10:
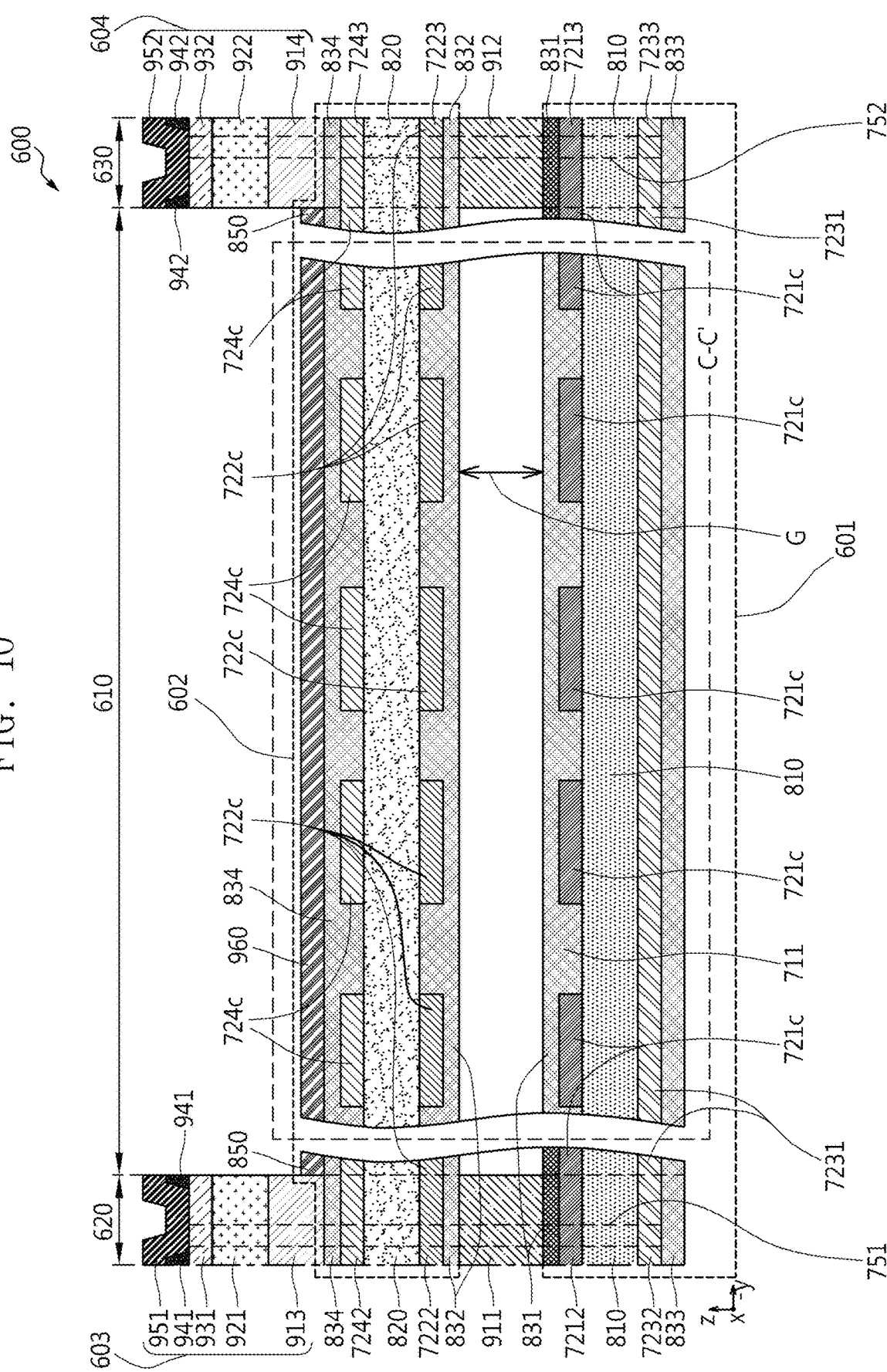
FIG. 10 illustrates a cross-sectional view for a C-C' line in a circuit board of FIG. 7A, according to an embodiment of the present disclosure.

FIG. 9 illustrates a cross-sectional view for a B-B' line in a circuit board 600 of FIG. 7A, according to an embodiment of the present disclosure. FIG. 10 illustrates a cross-sectional view for a C-C' line in a circuit board of FIG. 7A, according to an embodiment of the present disclosure.

In describing FIG. 9 and FIG. 10, redundant descriptions of at least a part of constituents of a circuit board 600 proposed by reference signs will be omitted.

Referring to FIG. 9 and FIG. 10, in an embodiment, one end (not shown) of a first layer 601 and one end (not shown) of a second layer 602 may be coupled through a first bonding layer 911 at a second portion 620. The other end (not shown) of the first layer 601 and the other end (not shown) of the second layer 602 may be coupled through a second bonding layer 912 at a third portion 630. A first bonding layer 911 and/or a second bonding layer 912 may include a prepreg having functions such as adhesion and insulation. A first layer 601 and a second layer 602 may be separated from a first portion 610. A gap G between a first layer 601 and a second layer 602 at a first portion 610 may differ according to an unfolded state or a bent state of the first portion 610.

According to an embodiment, a circuit board 600 may be positioned at an electronic device 30 such that a second layer 602 is folded inward in a folded state of the electronic device 30 of FIG. 3. According to an embodiment, a circuit board 600 may be positioned at an electronic device 30 such that a first layer 601 is folded inward in a folded state of the electronic device 30 of FIG. 3.

According to an embodiment, a second portion 620 of a circuit board 600 may include a third layer 603 coupled to a second layer 602 through a third bonding layer 913. A third layer 603 may include a third insulation layer 921 coupled to a fourth nonconductive material 834 through a third bonding layer 913. A third layer 603 may include a fifth ground pattern 931 coupled to a third insulation layer 921. A third insulation layer 921 may be positioned between a third bonding layer 913 and a fifth ground pattern 931. A third bonding layer 913 may include a prepreg having functions such as adhesion and insulation.

According to an embodiment, a third insulation layer 921 and a fifth ground pattern 931 may be produced based on a flexible copper clad laminate (FCCL) or a copper clad laminate (CCL).

According to an embodiment, a third layer 603 may include a fifth nonconductive material 941 which at least a partially cover a fifth ground pattern 931. A fifth ground pattern 931 is not exposed to the outside by a fifth nonconductive material 941, and thus oxidation thereof may be prevented.

According to an embodiment, a third layer 603 may include a second shielding member 951. A second shielding member 951 may at least partially cover a fifth nonconductive material 941. A second shielding member 951 may include various materials capable of shielding electromagnetic noise, and may be, for example, an EMI sheet. According to an embodiment, a second shielding member 951 may be electrically connected to a fifth ground pattern 931. For example, a part of a second shielding member 951 and a fifth ground pattern 931 may be short-circuited through a portion where a fifth nonconductive material 941 does not cover the fifth ground pattern 931.

Referring to FIG. 10, in an embodiment, a first ground pattern 721 (see FIG. 8) may include a second conductor 7212 extending to a second portion 620 and a third conductor 7213 extending to a third portion 630. A second ground pattern 722 (refer to FIG. 8) may include a second conductor 7222 extending to a second portion 620 and a third conductor 7223 extending to a third portion 630. A third ground pattern 723 may include a first conductor 7231 positioned at a first portion 610, a second conductor 7232 extending from a first conductor 7231 to a second portion 620, or a third conductor 7233 extending from the first conductor 7231 to a third portion 630. Referring to FIG. 7A and FIG. 10, at a second portion 620, a second conductor 7212 of a first ground pattern 721, a second conductor 7222 of a second ground pattern 722, a second conductor 7232 of a third ground pattern 723, a second conductor 7242 of a fourth ground pattern 724, and a fifth ground pattern 931 may be electrically connected through a plurality of first conductive vias 751. A plurality of first conductive vias 751 may be, for example, plated through holes (PTHs). According to various embodiments, at least a part of a second conductor 7212 of a first ground pattern 721, a second conductor 7222 of a second ground pattern 722, a second conductor 7232 of a third ground pattern 723, a second conductor 7242 of a fourth ground pattern 724, and a fifth ground pattern 931 may also be electrically connected through a laser via hole (LVH), a buried via hole (BVH), or a stacked via.

According to an embodiment, a second conductor 7212 of a first ground pattern 721, a second conductor 7222 of a second ground pattern 722, a second conductor 7232 of a third ground pattern 723, a second conductor 7242 of a fourth ground pattern 724, a fifth ground pattern 931, a plurality of first conductive vias 751, and a second shielding member 951 may produce a shielding structure at a second portion 620. A shielding structure may reduce electromagnetic interference with respect to a plurality of signal lines 711 and 712 (see FIG. 7A and FIG. 9), and thus signal integrity may be secured.

Referring to FIG. 9 and FIG. 10, in an embodiment, a third portion 630 of a circuit board 600 may include a fourth layer 604 coupled to a second layer 602 through a fourth bonding layer 914. A fourth layer 604 may include a fourth insulation layer 922 coupled to a fourth nonconductive material 834 through a fourth bonding layer 914. A fourth layer 604 may include a sixth ground pattern 932 coupled to a fourth insulation layer 922. A fourth insulation layer 922 may be positioned between a fourth bonding layer 914 and a sixth ground pattern 932. A fourth bonding layer 914 may include a prepreg having functions such as adhesion and insulation.

According to an embodiment, a fourth insulation layer 922 and a sixth ground pattern 932 may be produced based on a flexible copper clad laminate (FCCL) or a copper clad laminate (CCL).

According to an embodiment, a fourth layer 604 may include a sixth nonconductive material 942 which at least a partially covers a sixth ground pattern 932. A sixth ground pattern 932 is not exposed to the outside by a sixth nonconductive material 942, and thus oxidation thereof may be prevented.

According to an embodiment, a fourth layer 604 may include a third shielding member 952. A third shielding member 952 may at least partially cover a sixth nonconductive material 942. A third shielding member 952 may include various materials capable of shielding electromagnetic noise, and may be, for example, an EMI sheet. According to an embodiment, a third shielding member 952 may be electrically connected to a sixth ground pattern 932. For example, a part of a third shielding member 952 and a sixth ground pattern 932 may be short-circuited circuited through a portion where a sixth nonconductive material 942 does not cover the sixth ground pattern 932.

Referring to FIG. 7A and FIG. 10, at a third portion 630, a third conductor 7213 of a first ground pattern 721, a third conductor 7223 of a second ground pattern 722, a third conductor 7233 of a third ground pattern 723, a third conductor 7243 of a fourth ground pattern 724, and a sixth ground pattern 932 may be electrically connected through a plurality of second conductive vias 752. A plurality of second conductive vias 752 may be, for example, plated through holes (PTHs). According to various embodiments, at least a part of a third conductor 7213 of a first ground pattern 721, a third conductor 7223 of a second ground pattern 722, a third conductor 7233 of a third ground pattern 723, a third conductor 7243 of a fourth ground pattern 724, and a sixth ground pattern 932 may also be electrically connected through a laser via hole (LVH), a buried via hole (BVH), or a stacked via.

According to an embodiment, a third conductor 7213 of a first ground pattern 721, a third conductor 7223 of a second ground pattern 722, a third conductor 7233 of a third ground pattern 723, a third conductor 7243 of a fourth ground pattern 724, a sixth ground pattern 932, a plurality of second conductive vias 752, and a third shielding member 952 may produce a shielding structure at a third portion 630. A shielding structure may reduce electromagnetic interference with respect to a plurality of signal lines 711 and 712 (see FIG. 7A and FIG. 9), and thus signal integrity may be secured.

First, second, third, fourth, fifth, and sixth ground patterns 721, 722, 723, 724, 931, and 932, first and second conductive vias 751 and 752, a first shielding member 850, a second shielding member 951, and a third shielding member 952 may produce a ground structure having a corresponding potential. A ground structure and a plurality of signal lines 711 and 712 may not be short-circuited, and thus a signal transmitted through a plurality of signal lines 711 and 712 may be maintained. A ground structure may reduce electromagnetic interference with respect to a plurality of signal lines 711 and 712, and may reduce a loss of a signal having a designated or selected frequency (for example: a frequency signal) transmitted through the plurality of signal lines 711 and 712. For example, a ground structure may reduce the influence of external electromagnetic noise on a plurality of signal lines 711 and 712. For example, when a current flows through a plurality of signal lines 711 and 712, an electric field may be produced, and a ground structure may reduce the influence of the electric field on an electric element around a circuit board 600.

According to an embodiment, a first portion 610, a second portion 620, and a third portion 630 of a circuit board 600 may produce impedance which is substantially the same or is included in a threshold range. Impedance matching between a first portion 610, a second portion 620, and a third portion 630 may reduce a power loss and/or a transmission loss when a signal having a designated or selected frequency is transmitted through a plurality of signal lines 711 and 712. In order to produce impedance corresponding to a designated or selected frequency, materials or forms (for example: a thickness or a width) of constituents of a circuit board 600 may be variously provided. For example, at least one insulation material included in a circuit board 600 may have various dielectric constants or dielectric loss factors so as to produce impedance corresponding to a designated or selected frequency. An insulation material may include, for example, a first insulation layer 810, a second insulation layer 820, a third insulation layer 921, a fourth insulation layer 922, a first bonding layer 911, a second bonding layer 912, a third bonding layer 913, a fourth bonding layer 914, a first nonconductive material 831, a second nonconductive material 832, a third nonconductive material 833, a fourth nonconductive material 834, a fifth nonconductive material 941, or a sixth nonconductive material 942. The lower a dielectric constant or a dielectric loss factor of at least one insulation layer included in a circuit board 600 is, the higher propagation speed a circuit board 600 may support through a plurality of signal lines 711 and 712. According to an embodiment, at least one insulation material included in a circuit board 600 may have a high frequency characteristic (for example: a low dielectric constant or a low dielectric loss factor).

According to various embodiments (not shown), a circuit board 600 may omit at least one of constituents or may additionally include other constituents. For example, although not illustrated, at least one inner layer based on a flexible copper clad laminate may be further added to a first layer 601 or a second layer 602.

According to various embodiments (not shown), a rigid printed circuit board in which ground patterns facing each other around a signal line are produced in a meander form may be provided. While not including a conductive via for short-circuiting ground patterns, a rigid printed circuit board, identically to a circuit board 600 of FIG. 6, may secure signal integrity at a designated or selected frequency due to meander form ground patterns facing each other.

Figure 11:
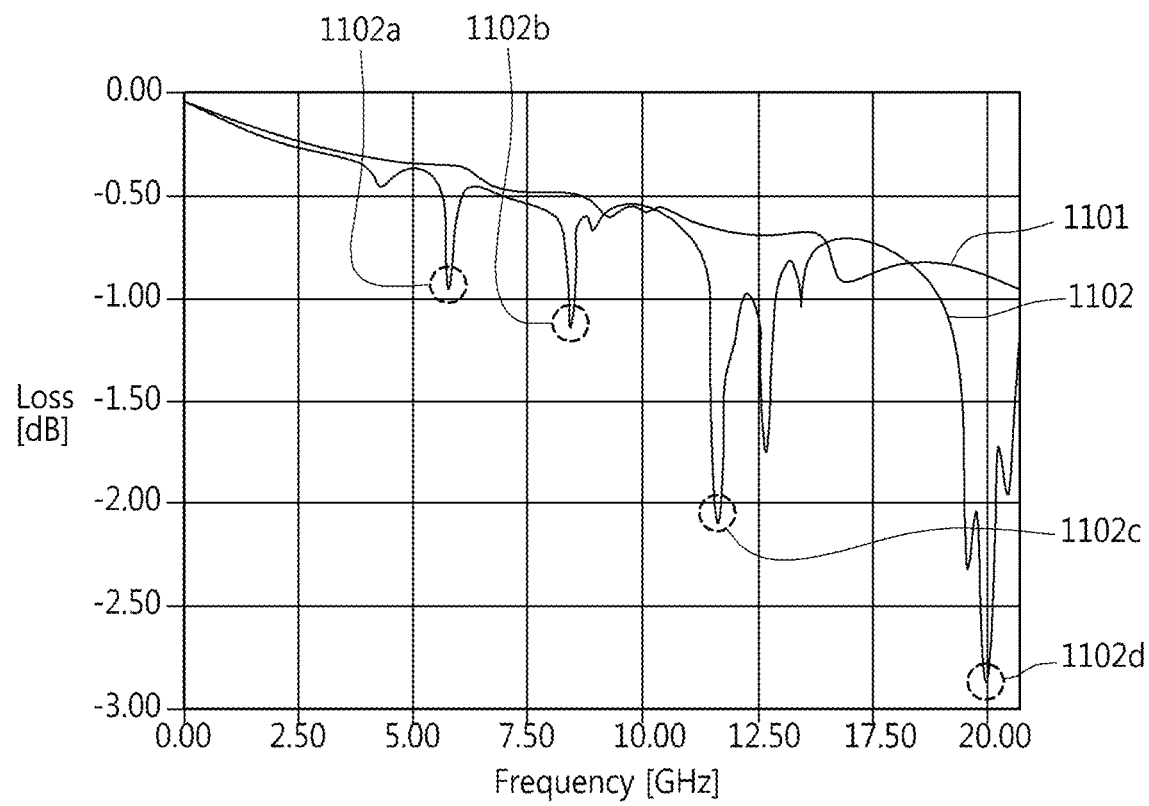
FIG. 11 illustrates a graph showing a loss on a frequency distribution with respect to a circuit board of FIG. 6, according to an embodiment of the present disclosure.

FIG. 11 illustrates a graph showing a loss on a frequency distribution with respect to a circuit board 600 of FIG. 6, according to an embodiment of the present disclosure.

Referring to FIG. 11, for example, a reference sign 1101 indicates a loss on a frequency distribution with respect to a first case where first conductive patterns 721a, 722a, and 724a, second conductive patterns 721b, 722b, and 724b, and third conductive patterns 721c, 722c, and 724c positioned at a first portion 610 of a circuit board 600 (see FIG. 6) are provided in a meander form as illustrated in FIG. 7A. A reference sign 1102 indicates a loss on a frequency distribution with respect to a second case where first conductive patterns 721a, 722a, 724a, second conductive patterns 721b, 722b, 724b, and third conductive patterns 721c, 722c, and 724c positioned at a first portion 610 of a circuit board 600 (see FIG. 6) are provided in a straight line form 730 as illustrated in FIG. 7A. The second case is provided as comparison with the first case. When comparing losses on a frequency distribution indicated by reference signs 1101 and 1102, resonance may be produced at several frequencies in the second case (reference signs 1102a, 1102b, and 1102c) compared to the first case. Accordingly, a frequency of a signal transmittable through a signal line while reducing a power loss and/or a transmission loss may not be more various or limited in the first case than in the second case. In the first case, compared to the second case, a signal may be transmitted even in a wide frequency band without a loss due to resonance.

Figure 12:
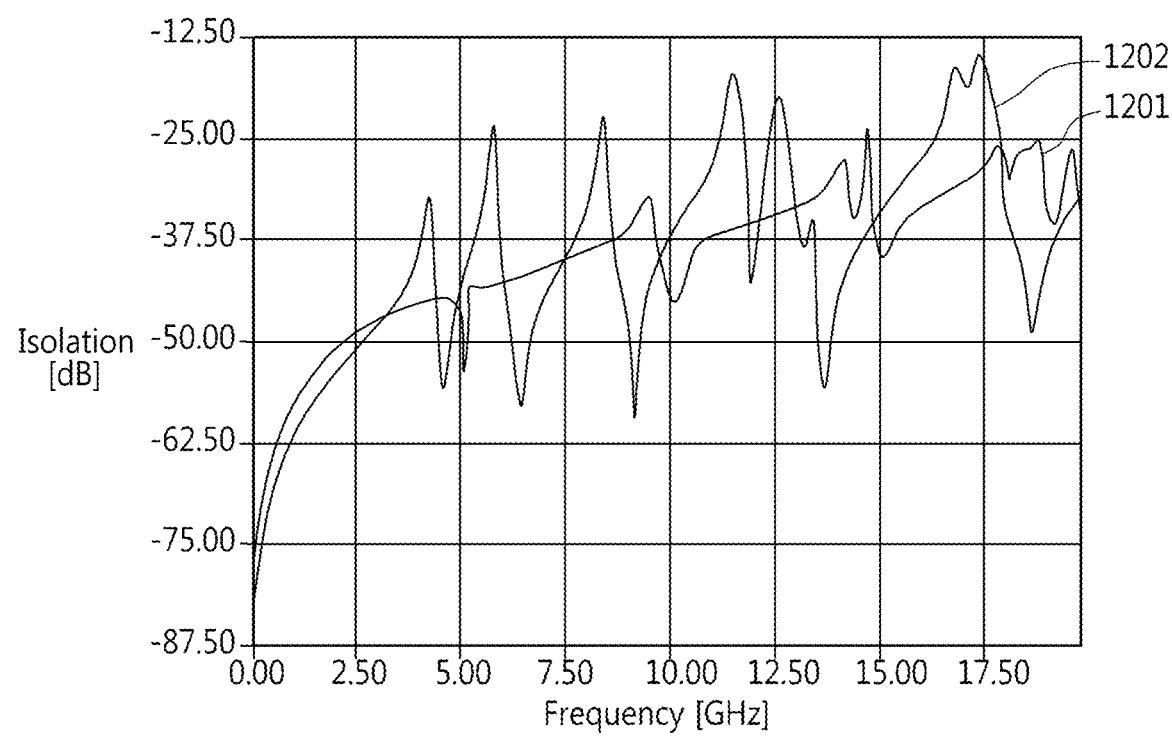
FIG. 12 illustrates a graph showing interference on a frequency distribution with respect to a circuit board of FIG. 6, according to an embodiment of the present disclosure.

FIG. 12 illustrates a graph showing interference (for example: isolation) on a frequency distribution with respect to a circuit board 600 of FIG. 6, according to an embodiment of the present disclosure.

Referring to FIG. 12, for example, a reference sign 1201 indicates interference on a frequency distribution with respect to a first case where first conductive patterns 721a, 722a, and 724a, second conductive patterns 721b, 722b, and 724b, and third conductive patterns 721c, 722c, and 724c positioned at a first portion 610 of a circuit board 600 (see FIG. 6) are provided in a meander form as illustrated in FIG. 7A. A reference sign 1202 indicates interference on a frequency distribution with respect to a second case where first conductive patterns 721a, 722a, 724a, second conductive patterns 721b, 722b, 724b, and third conductive patterns 721c, 722c, and 724c positioned at a first portion 610 of a circuit board 600 (see FIG. 6) are provided in a straight line form 730 as illustrated in FIG. 7A. When comparing interference on a frequency distribution indicated by reference signs 1201 and 1202, it may be known that the influence of noise is smaller in various frequency bands in the first case than in the second case. Accordingly, a frequency of a signal transmittable through a signal line while reducing electromagnetic interference may not be more various or limited in the first case than in the second case.

According to an embodiment, an electronic device may include: a first electric element and a second electric element; and a circuit board (for example: a circuit board 600 of FIG. 6) which delivers a signal of a designated or selected frequency between the first electric element and the second electric element. The circuit board may include a first portion (for example: a first portion 610 of FIG. 6), a second portion (for example: a second portion 620 of FIG. 6), and a third portion (for example: a third portion 630 of FIG. 6), the second and third portions extending from the first portion with the first portion therebetween. The circuit board may include at least one signal line (for example: a plurality of signal lines 711 and 712 of FIG. 7A or FIG. 8) extending from the second portion to the third portion. The circuit board may include a plurality of ground patterns (for example: a first ground pattern 721 and a second ground pattern 722 of FIG. 8) extending from the second portion to the third portion and at least partially overlapping each other. The circuit board may include a plurality of first conductive vias (for example: a plurality of first conductive vias 751 of FIG. 7A or FIG. 10) positioned at the second portion and electrically connecting the plurality of ground patterns to each other. The circuit board may include a plurality of second conductive vias (for example: a plurality of second conductive vias 752 of FIG. 7A or FIG. 10) positioned at the third portion and electrically connecting the plurality of ground patterns to each other. The plurality of ground patterns may include a meander form at the first portion According to an embodiment, the first portion (for example: a first portion 610 of FIG. 6 or FIG. 7A) may be flexible, and the second portion (for example: a second portion 620 of FIG. 6 or FIG. 7A) and the third portion (for example: a third portion 630 of FIG. 6 or FIG. 7A) may be more rigid than the first portion.

According to an embodiment, the circuit board (for example: a circuit board 600 of FIG. 8) may include a first layer (for example: a first layer 601 of FIG. 8, FIG. 9, or FIG. 10) and a second layer (for example: a second layer 602 of FIG. 8, FIG. 9, or FIG. 10) which extend from the second portion (for example: a second portion 620 of FIG. 6 or FIG. 7A) to the third portion (for example: a third portion 630 of FIG. 6 or FIG. 7A). The first and second layers may be separated from each other at the first portion. The plurality of ground patterns may include a first ground pattern (for example: a first ground pattern 721 of FIG. 8) which is included in the first layer and has the meander form at the first portion. The plurality of ground patterns may include a second ground pattern (for example: a second ground pattern 722 of FIG. 8) which is included in the second layer, at least partially overlaps the first ground pattern, and has the meander form at the first portion. The at least one signal line (for example: a plurality of signal lines 711 and 712 of FIG. 7A or FIG. 8) may be included in the first layer and may not overlap the first ground pattern and the second ground pattern.

According to an embodiment, the circuit board (for example: a circuit board 600 of FIG. 9 or FIG. 10) may include a first bonding layer (for example: a first bonding layer 911 of FIG. 9 or FIG. 10) which is positioned at the second portion (for example: a second portion 620 of FIG. 9 or FIG. 10) and is made of an insulation material for coupling the first layer (for example: a first layer 601 of FIG. 9 or FIG. 10) and the second layer (for example: a second layer 602 of FIG. 9 or FIG. 10). The circuit board may include a second bonding layer (for example: a second bonding layer 912 of FIG. 9 or FIG. 10) which is positioned at the third portion (for example: a third portion 630 of FIG. 9 or FIG. 10) and is made of an insulation material for coupling the first layer and the second layer.

According to an embodiment, the first layer (for example: a first layer 601 of FIG. 8) may include a first insulation layer (for example: a first insulation layer 810 of FIG. 8) at which the at least one signal line (for example: a plurality of signal lines 711 and 712 of FIG. 8) and the first ground pattern (for example: a first ground pattern 721 of FIG. 8) are positioned. The second layer (for example: a second layer 602 of FIG. 8) may include a second insulation layer (for example: a second insulation layer 820 of FIG. 8) at which the second ground pattern (for example: a second ground pattern 722 of FIG. 8) is positioned. The at least one signal line, the first ground pattern, and the second ground pattern may be positioned between the first insulation layer and the second insulation layer.

According to an embodiment, the circuit board (for example: a circuit board 600 of FIG. 8) may include a first nonconductive material (for example: a first nonconductive material 831 of FIG. 8) which is included in the first layer (for example: a first layer 601 of FIG. 8) and covers the first ground pattern (for example: a first ground pattern 721 of FIG. 8). The circuit board may include a second nonconductive material (for example: a second nonconductive material 832 of FIG. 8) which is included in the second layer (for example: a second layer 602 of FIG. 8) and covers the second ground pattern (for example: a second ground pattern 722 of FIG. 8).

According to an embodiment, the first insulation layer (for example: a first insulation layer 810 of FIG. 8) and the second insulation layer (a second insulation layer 820 of FIG. 8) may have dielectric constants different from each other.

According to an embodiment, the first layer (for example: a first layer 601 of FIG. 8) may include a third ground pattern (for example: a third ground pattern 723 of FIG. 8) which is positioned at the first insulation layer (for example: a first insulation layer 810 of FIG. 8). The first insulation layer may be positioned between the first ground pattern (for example: a first ground pattern 721 of FIG. 8) and the third ground pattern. The third ground pattern may overlap the first ground pattern and the signal line (for example: a plurality of signal lines 711 and 712 of FIG. 8). The third ground pattern may be electrically connected to the first ground pattern and the second ground pattern (for example: a second ground pattern 722 of FIG. 8) through the plurality of first conductive vias (for example: a plurality of conductive vias 751 of FIG. 7A or FIG. 10) and the plurality of second conductive vias (for example: a plurality of second conductive vias 752 of FIG. 7A or FIG. 10).

According to an embodiment, the second layer (for example: a second layer 602 of FIG. 8) may include a fourth ground pattern (for example: a fourth ground pattern of FIG. 8) which is positioned at the second insulation layer (for example: a second insulation layer 820 of FIG. 8). The second insulation layer (for example: a second layer 602 of FIG. 8) may be positioned between the second ground pattern (for example: a second ground pattern 722 of FIG. 8) and the fourth ground pattern. The fourth ground pattern may include the meander form at the first portion. The fourth ground pattern may at least partially overlap the second ground pattern. The fourth ground pattern may be electrically connected to the first ground pattern (for example: a first ground pattern 721 of FIG. 8), the second ground pattern, and the third ground pattern (for example: a third ground pattern 723 of FIG. 8) through the plurality of first conductive vias (for example: a plurality of first conductive vias 751 of FIG. 7A or FIG. 10) and the plurality of second conductive vias (for example: a plurality of second conductive vias 752 of FIG. 7A or FIG. 10).

According to an embodiment, the second portion (for example: a second portion 620 of FIG. 9 or FIG. 10) of the circuit board (for example: a circuit board 600 of FIG. 9 or FIG. 10) may include a third layer (for example: a third layer 603 of FIG. 9 or FIG. 10) which is coupled to the second layer (for example: a second layer 602 of FIG. 9 or FIG. 10) through an insulation material (for example: a third bonding layer 913 of FIG. 9 or FIG. 10). The third layer may include a fifth ground pattern (for example: a fifth ground pattern 931 of FIG. 9 or FIG. 10) and a third insulation layer (for example: a third insulation layer 921 of FIG. 9 or FIG. 10) between the fifth ground pattern and the second layer. The fifth ground pattern may be electrically connected to the first ground pattern (for example: a first ground pattern 721 of FIG. 8), the second ground pattern (for example: a second ground pattern 722 of FIG. 8), the third ground pattern (for example: a third ground pattern 723 of FIG. 8), and the fourth ground pattern (for example: a fourth ground pattern 724 of FIG. 8) through the plurality of first conductive vias (for example: a plurality of first conductive vias 751 of FIG. 7A or FIG. 10).

According to an embodiment, the third portion (for example: a third portion 630 of FIG. 9 or FIG. 10) of the circuit board (for example: a circuit board 600 of FIG. 9 or FIG. 10) may include a fourth layer (for example: a fourth layer 604 of FIG. 9 or FIG. 10) which is coupled to the second layer (for example: a second layer 602 of FIG. 9 or FIG. 10) through an insulation material (for example: a fourth bonding layer 914 of FIG. 9 or FIG. 10). The fourth layer may include a sixth ground pattern (for example: a sixth ground pattern 932 of FIG. 9 or FIG. 10) and a fourth insulation layer (for example: a fourth insulation layer 922 of FIG. 9 or FIG. 10) between the sixth ground pattern and the second layer. The sixth ground pattern may be electrically connected to the first ground pattern (for example: a first ground pattern 721 of FIG. 8), the second ground pattern (for example: a second ground pattern 722 of FIG. 8), the third ground pattern (for example: a third ground pattern 723 of FIG. 8), and the fourth ground pattern (for example: a fourth ground pattern 724 of FIG. 8) through the plurality of second conductive vias (for example: a plurality of second conductive vias 752 of FIG. 7A or FIG. 10).

According to an embodiment, the designated or selected frequency may include 6-100 GHz.

According to an embodiment, the electronic device (for example: an electronic device 30 of FIG. 3) may include a foldable housing (for example: a foldable housing 300 of FIG. 3). The foldable housing may include a first housing portion (for example: a first housing structure 310 of FIG. 3) including a first surface (for example: a first surface 3001 of FIG. 3) facing a first direction and a second surface (for example: a second surface 3002 of FIG. 3) facing a second direction opposite to the first direction, and a second housing portion (for example: a second housing structure 320 of FIG. 4) including a third surface (for example: a third surface 3003 of FIG. 3) facing a third direction and a fourth surface (for example: a fourth surface 3004 of FIG. 3) facing a fourth direction opposite to the third direction. The electronic device may include a flexible display (for example: a flexible (or foldable) display 400 of FIG. 3) which extends from the first surface to the third surface. The circuit board (for example: a circuit board 600 of FIG. 6) may be positioned in the foldable housing. The second portion (for example: a second portion 620 of FIG. 6) may be positioned at the first housing portion. The third portion (for example: a third portion 630 of FIG. 6) may be positioned at the second housing portion. The first portion may be positioned across the first housing portion and the second housing portion.

According to an embodiment, in a state where the foldable housing (for example: a foldable housing 300 of FIG. 3) is folded, the first surface (for example: a first surface 3001 of FIG. 3) and the third surface (for example: a third surface 3303 of FIG. 3) may face each other.

According to an embodiment, in a state where the foldable housing (for example: a foldable housing 300 of FIG. 3) is folded, the second surface (for example: a second surface 3002 of FIG. 3) and the fourth surface (for example: a fourth surface 3004 of FIG. 3) may face each other.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a first electric element and a second electric element; and
a circuit board configured to deliver a signal of a designated or selected frequency between the first electric element and the second electric element and includes a first portion, a second portion, and a third portion, wherein the second portion and the third portion extend from the first portion with the first portion therebetween, and wherein the circuit board comprises:
at least one signal line extending from the second portion to the third portion;
a plurality of ground patterns extending from the second portion to the third portion and at least partially overlapping each other;
a plurality of first conductive vias positioned at the second portion and electrically connecting the plurality of ground patterns to each other; and
a plurality of second conductive vias positioned at the third portion and electrically connecting the plurality of ground patterns to each other,
wherein the plurality of ground patterns include a meander form at the first portion, and
wherein the circuit board comprises a first layer and a second layer that extend from the second portion to the third portion, the first layer and the second layer face each other in a nonbonded state at the first portion.

2. The electronic device of claim 1, wherein:
the first portion is flexible, and
the second and third portions are more rigid than the first portion.

3. The electronic device of claim 2, wherein:
the plurality of ground patterns comprise a first ground pattern that is included in the first layer and includes the meander form at the first portion and a second ground pattern that is included in the second layer, at least partially overlaps the first ground pattern, and includes the meander form at the first portion, and
the at least one signal line is included in the first layer and does not overlap the first ground pattern and the second ground pattern.

4. The electronic device of claim 3, wherein the circuit board further comprises:
a first bonding layer that is positioned at the second portion and is made of an insulation material for coupling the first layer and the second layer; and
a second bonding layer that is positioned at the third portion and is made of an insulation material for coupling the first layer and the second layer.

5. The electronic device of claim 3, wherein:
the first layer further comprises a first insulation layer that the at least one signal line and the first ground pattern are positioned,
the second layer further comprises a second insulation layer at that the second ground pattern is positioned, and
the at least one signal line, the first ground pattern, and the second ground pattern are positioned between the first insulation layer and the second insulation layer.

6. The electronic device of claim 5, wherein the circuit board further comprises:
a first nonconductive material that is included in the first layer and covers the first ground pattern; and
a second nonconductive material that is included in the second layer and covers the second ground pattern.

7. The electronic device of claim 5, wherein the first insulation layer and the second insulation layer includes dielectric constants different from each other.

8. The electronic device of claim 5, wherein:
the first layer further comprises a third ground pattern that is positioned at the first insulation layer, and
the first insulation layer is positioned between the first ground pattern and the third ground pattern,
the third ground pattern overlaps the first ground pattern and the signal line and is electrically connected to the first ground pattern and the second ground pattern through the plurality of first conductive vias and the plurality of second conductive vias.

9. The electronic device of claim 8, wherein:
the second layer further comprises a fourth ground pattern that is positioned at the second insulation layer,
the second insulation layer is positioned between the second ground pattern and the fourth ground pattern, and
the fourth ground pattern includes the meander form at the first portion, at least partially overlaps the second ground pattern, and is electrically connected to the first ground pattern, the second ground pattern, and the third ground pattern through the plurality of first conductive vias and the plurality of second conductive vias.

10. The electronic device of claim 9, wherein:
the second portion of the circuit board further comprises a third layer that is coupled to the second layer through an insulation material,
the third layer includes a fifth ground pattern and a third insulation layer between the fifth ground pattern and the second layer, and
the fifth ground pattern is electrically connected to the first ground pattern, the second ground pattern, the third ground pattern, and the fourth ground pattern through the plurality of first conductive vias.

11. The electronic device of claim 10, wherein:
the third portion of the circuit board further comprises a fourth layer that is coupled to the second layer through an insulation material,
the fourth layer includes a sixth ground pattern and a fourth insulation layer between the sixth ground pattern and the second layer,
the sixth ground pattern is electrically connected to the first ground pattern, the second ground pattern, the third ground pattern, and the fourth ground pattern through the plurality of second conductive vias.

12. The electronic device of claim 1, wherein the designated or selected frequency includes 6-100 GHz.

13. The electronic device of claim 1, further comprising:
a foldable housing that includes a first housing portion including a first surface facing a first direction and a second surface facing a second direction opposite to the first direction, and a second housing portion including a third surface facing a third direction and a fourth surface facing a fourth direction opposite to the third direction; and
a flexible display that extends from the first surface to the third surface,
wherein the circuit board is positioned in the foldable housing,
wherein the second portion is positioned at the first housing portion,
wherein the third portion is positioned at the second housing portion, and
wherein the first portion is positioned across the first housing portion and the second housing portion.

14. The electronic device of claim 13, wherein in a state where the foldable housing is folded, the first surface faces the third surface.

15. The electronic device of claim 13, wherein in a state where the foldable housing is folded, the second surface faces the fourth surface.

16. A circuit board comprising:
a first portion, a second portion, and a third portion, the second and third portions extending from the first portion with the first portion therebetween;
at least one signal line extending from the second portion to the third portion;
a plurality of ground patterns extending from the second portion to the third portion and at least partially overlapping each other;
a plurality of first conductive vias positioned at the second portion and electrically connecting the plurality of ground patterns to each other; and
a plurality of second conductive vias positioned at the third portion and electrically connecting the plurality of ground patterns to each other,
wherein the plurality of ground patterns include a meander form at the first portion, and
wherein the circuit board comprises a first layer and a second layer that extend from the second portion to the third portion, the first layer and the second layer face each other in a nonbonded state at the first portion.

17. The circuit board of claim 16, wherein:
the first portion is flexible, and
the second and third portions are more rigid than the first portion.

18. The circuit board of claim 17, wherein the plurality of ground patterns comprise a first ground pattern that is included in the first layer and includes the meander form at the first portion and a second ground pattern that is included in the second layer, at least partially overlaps the first ground pattern, and includes the meander form at the first portion, and
wherein the at least one signal line is included in the first layer and does not overlap the first ground pattern and the second ground pattern.

19. The circuit board of claim 18, further comprising:
a first bonding layer that is positioned at the second portion and is made of an insulation material for coupling the first layer and the second layer; and
a second bonding layer that is positioned at the third portion and is made of an insulation material for coupling the first layer and the second layer.

20. The circuit board of claim 18, wherein:
the first layer further comprises a first insulation layer at that the at least one signal line and the first ground pattern are positioned,
the second layer further comprises a second insulation layer at that the second ground pattern is positioned, and
the at least one signal line, the first ground pattern, and the second ground pattern are positioned between the first insulation layer and the second insulation layer.

* * * * *